United States Patent
Kikuchi

(10) Patent No.: US 6,559,697 B2
(45) Date of Patent: May 6, 2003

(54) MULTIPLIED CLOCK GENERATING CIRCUIT

(75) Inventor: Haruhide Kikuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/097,430

(22) Filed: Mar. 15, 2002

(65) Prior Publication Data

US 2002/0145456 A1 Oct. 10, 2002

(30) Foreign Application Priority Data

Mar. 16, 2001 (JP) ........................................ 2001-075934

(51) Int. Cl.[7] .............................................. H03L 7/06
(52) U.S. Cl. ........................................ 327/156; 327/147
(58) Field of Search .................................. 327/147, 151, 327/154, 155, 156, 160, 146; 331/25, DIG. 2; 375/375, 376, 371

(56) References Cited

U.S. PATENT DOCUMENTS

| | | | |
|---|---|---|---|
| 5,389,898 A | * | 2/1995 | Taketoshi et al. ............... 331/2 |
| 5,945,856 A | | 8/1999 | Yanagiuchi .................. 327/159 |
| 6,275,553 B1 | * | 8/2001 | Esaki ......................... 375/371 |

FOREIGN PATENT DOCUMENTS

JP        2000-244309        9/2000

* cited by examiner

Primary Examiner—Timothy P Callahan
Assistant Examiner—Linh Nguyen
(74) Attorney, Agent, or Firm—Oblon, Spivak, McClelland, Maier & Neustadt, P.C.

(57) ABSTRACT

A multiplied clock generating circuit for generating and outputting an output clock signal that has a higher frequency than an input clock by a factor M is described. The multiplied clock generating circuit comprising: a frequency divider circuit which is configured to generate a feedback clock signal by dividing the output clock signal by a factor M; a phase comparator circuit which is configured to receive the input clock signal and the feedback clock signal as generated by the frequency divider circuit, to compare the phase of the input clock signal with the phase of the feedback clock signal and to output a phase displacement signal indicative of the phase relationship between the input clock signal and the feedback clock signal; a comparator which is configured to receive the phase displacement signal, to count the output clock signal within each cycle of the feedback clock signal while the phase displacement signal is indicative that there is a phase displacement between the feedback clock signal and the input clock signal, to compare the numbers as counted in successive cycles of the feedback clock signal, and to output a delay time adjustment signal on the basis of the result of the comparison; and an oscillator circuit which is capable of controlling the output clock signal in the clock period thereof by an increment(s) of a predetermined delay time on the basis of the delay time adjustment signal and outputting the output clock signal as controlled.

13 Claims, 27 Drawing Sheets

FIG.12
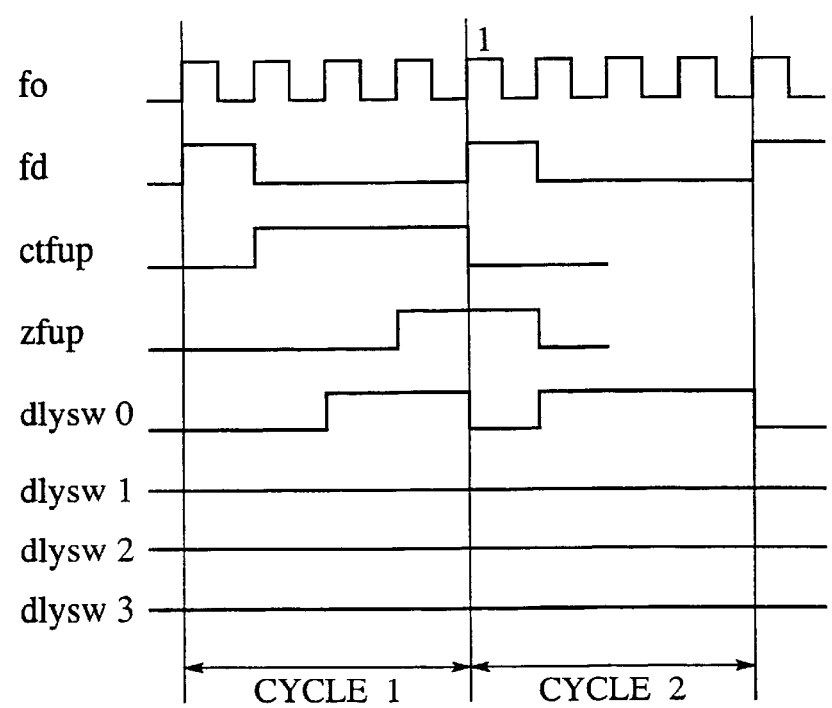
(a)
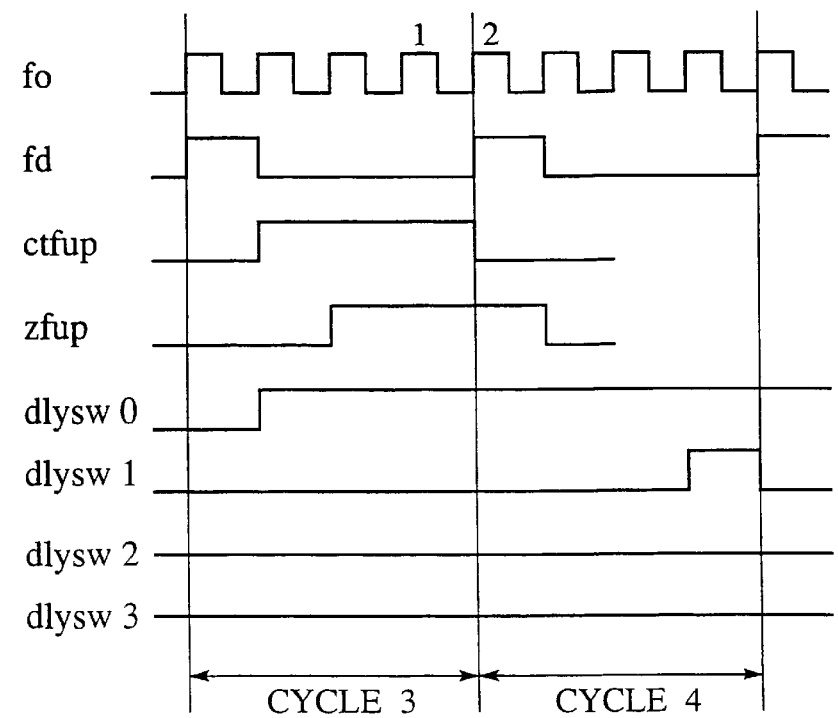
(b)

MULTIPLIED CLOCK GENERATING CIRCUIT

CROSS REFERENCE TO RELATED APPLICATIONS

This application is based upon and claims the benefit of priority from prior Japanese Patent Application P2001-75934 filed on Mar. 16th, 2001; the entire contents of which are incorporated by reference herein.

BACKGROUND OF THE INVENTION

1. Field of the Invention

The present invention relates generally to digital circuits, and more particularly relates to a multiplied clock generating circuit for generating and outputting a times-M clock signal that has a higher frequency than an arbitrary input clock by a factor M.

2. Description of the Related Art

FIG. 1 is a schematic diagram showing an example of a multiplied clock generating circuit for generating a feedback clock signal fd by dividing an output clock signal fo by M and controlling the frequency and the phase of the feedback clock signal fd to match those of an input clock signal fr. In the figure, the multiplied clock generating circuit is composed of a frequency divider circuit 101, a phase comparator circuit 102, a frequency comparator circuit 103, a clock phase synchronization circuit 104, an oscillator control circuit 105 and an oscillator circuit 106.

The frequency divider circuit 101 serves to generate the feedback clock signal fd by dividing by M the output clock signal fo while the phase comparator circuit 102 serves to detect the phase difference between the input clock signal fr and the feedback clock signal fd and output the result of detection to the frequency comparator circuit 103 and the clock phase synchronization circuit 104. The frequency comparator circuit 103 and the clock phase synchronization circuit 104 serve to calculate how much the output clock signal fo should be modified for adjusting the frequency and the phase of the feedback clock signal fd to the input clock signal fr on the basis of information given by the phase comparator circuit 102, and outputting the results to the oscillator control circuit 105. The oscillator control circuit 105 takes control of the oscillator circuit 106 to modify the output clock signal fo on the basis of the information as given from the frequency comparator circuit 103 and the clock phase synchronization circuit 104.

FIG. 2 is a schematic diagram showing an example of the configuration of the oscillator circuit 106. In the figure, the oscillator circuit 106 is composed of a fixed-delay-time delay circuit 111, a variable-delay-time delay circuit 112 and an oscillation control circuit 113. The variable-delay-time delay circuit 112 is composed of four variable-delay-time delay cells (dcell) 114. The delay time of each variable-delay-time delay cell 114 is (d+Δd) when the signal dlysw* (*=0 to 3) is set to a low level and is d when the signal dlysw*(*=0 to 3) is set to a high level. When a signal osc_act is low, the output clock signal fo is fixed to a low level by the oscillation control circuit 113 so that the oscillation of the oscillator circuit is halted. Accordingly, the oscillator control circuit 105 receives the information from the frequency comparator circuit 103 and the clock phase synchronization circuit 104 and takes control of the variable-delay-time delay cell 114 in order to modify the delay time thereof.

For example, if the input signals to the variable-delay-time delay cells 114 are fixed dlysw3=dlysw2=low and dlysw1=dlysw0=high so that the feedback clock signal fd has a frequency τ1 lower than that of the input clock signal fr while the input signals to the variable-delay-time delay cells 114 are fixed dlysw3=low and dlysw1=dlysw0=dlysw2=high so that the feedback clock signal fd has a frequency τ2 higher than that of the input clock signal fr, then the input signals to the variable-delay-time delay cells 114 are fixed such that dlysw3=low and dlysw1=dlysw0=high while the signal dlysw2 is controlled by maintaining or inverting it for each cycle of the feedback clock signal fd in order to the clock period of the feedback clock signal fd is either τ1 or τ2 as illustrated in the timing chart of FIG. 3.

FIG. 3 is a timing chart in which the phase of the feedback clock signal fd is adjusted in order that the rising edge of the feedback clock signal fd coincides with the rising edge of the input clock signal fr. Since the rising edge edge0 of the feedback clock signal fd is advanced ahead of the rising edge of the input clock signal fr, the clock period of the feedback clock signal fd starting from the rising edge edge0 is set to τ1 which is longer than the clock period of the input clock signal fr. On the other hand, since the rising edge edge1 lags behind the rising edge of the input clock signal fr, the clock period of the feedback clock signal fd starting from the rising edge edge1 is then set to τ2, which is shorter than the clock period of the input clock signal fr and maintained until the rising edge edge4 appears from which the rising edge of the feedback clock signal fd is advanced again ahead of the rising edge of the input clock signal fr. Thereafter, the clock period of the feedback clock signal fd starting from the rising edge edge4 is set to τ1 which is longer than the clock period of the input clock signal fr while the clock period of the feedback clock signal fd starting from the rising edge edge5 is set to τ2 in the same manner.

Also, as illustrated in FIG. 3, if the multiplication factor of the input clock signal fr is M, the period τ1 and the period τ2 are calculated as $$\tau1=[(d+\Delta d)\times2+d\times2]\times2\times M$$

$$\tau2=[(d+\Delta d)\times1+d\times3]\times2\times M.$$

and therefore the difference between the period τ1 and the period τ2 is calculated as $$\tau1-\tau2=M\times\Delta d\times2.$$

The difference between the period τ1 and the period τ2 ensues jittering of the feedback clock signal fd and, understood from the above described equations, the amount of jittering becomes large as the multiplication factor M becomes large so that it can be the case that the specification of the system can not be satisfied.

FIG. 4 is a timing chart showing the relationship among the feedback clock signal fd, the output clock signal fo, the signal dlysw2 and the input clock signal fr as described above, in which FIG. 4(a) is a graphic diagram showing the feedback clock signal fd with the clock period of τ1; FIG. 4(b) is a graphic diagram showing the feedback clock signal fd with the clock period of τ2; and FIG. 4(c) is a graphic diagram showing the input clock signal fr. As illustrated in FIG. 4, while the clock period of the feedback clock signal fd switches between the period τ1 and the period τ2, the output clock signal fo has the jitter of (Δd×2) while the feedback clock signal fd has the jitter of (M×Δd×2).

FIG. 5 is a graphic diagram showing the relationship between the jitter of the feedback clock signal fd and the jitter of the variable delay Δd with reference to the multiplication factor M in the case where the output frequency of the output clock signal fo is fixed to a desired value. In the figure, when a higher frequency output clock signals is desired, it is understood that the variable delay Δd has to be set to a smaller value in order to suppress the jitter of the feedback clock signal fd.

In contrast with this, with the recent advent of high speed semiconductor devices and therefore the increase in the clock frequency as required in the system for keeping pase therewith, a higher multiplication factor is increasingly required of the multiplied clock generating circuit. Because of this, it is difficult to generate an output clock with a higher multiplication factor simply by controlling the variable delay Δd as illustrated in FIG. 5.

In the case where the output clock signal fo is generated by multiplying the input clock signal fr by the multiplication factor M (M is an arbitrary integer) and divided by M in order to generate the feedback clock signal fd, which is always controlled to match the input clock signal fr as described above, the clock period of the feedback clock signal fd is controlled in order to switch between the period τ1 corresponding to a frequency lower than that of the input clock signal fr and the period τ2 corresponding to a frequency higher than that of the input clock signal fr. Because of this, the jitter of the feedback clock signal fd is proportional to the multiplication factor M so that it becomes difficult to suppress the jitter of the feedback clock signal fd when a higher frequency output clock signals as multiplied by a larger multiplication factor M is needed.

BRIEF SUMMARY OF THE INVENTION

An aspect of the present invention provides a multiplied clock generating circuit for generating and outputting an output clock signal that has a higher frequency than an input clock by a factor M, said multiplied clock generating circuit comprising: a frequency divider circuit which is configured to generate a feedback clock signal by dividing said output clock signal by a factor M; a phase comparator circuit which is configured to receive said input clock signal and said feedback clock signal as generated by said frequency divider circuit, to compare the phase of said input clock signal with the phase of said feedback clock signal and to output a phase displacement signal indicative of the phase relationship between said input clock signal and said feedback clock signal; a comparator which is configured to receive said phase displacement signal, to count said output clock signal within each cycle of said feedback clock signal while said phase displacement signal is indicative that there is a phase displacement between said feedback clock signal and said input clock signal, to compare the numbers as counted in successive cycles of said feedback clock signal, and to output a delay time adjustment signal on the basis of the result of the comparison; and an oscillator circuit which is capable of controlling said output clock signal in the clock period thereof by an increment(s) of a predetermined delay time on the basis of said delay time adjustment signal and outputting said output clock signal as controlled.

Another aspect of the present invention provides a multiplied clock generating circuit for generating and outputting an output clock signal that has a higher frequency than an input clock by a factor M, said multiplied clock generating circuit comprising: a frequency divider circuit which is configured to generate a feedback clock signal by dividing said output clock signal by a factor M; a phase comparator circuit which is configured to receive said input clock signal and said feedback clock signal as generated by said frequency divider circuit, to compare the phase of said input clock signal with the phase of said feedback clock signal and to output a phase displacement signal indicative of the phase relationship between said input clock signal and said feedback clock signal; a phase control circuit which is configured to receive said phase displacement signal, to count said output clock signal within each cycle of said feedback clock signal while said phase displacement signal is indicative that there is a phase displacement between said feedback clock signal and said input clock signal, to compare the numbers as counted in successive cycles of said feedback clock signal, and to output a phase adjustment signal on the basis of the result of the comparison in the case where the same count of said feedback clock signal is maintained for a predetermined number of cycles; and an oscillator circuit which is configured to receive said phase adjustment signal from said phase control circuit as a delay time adjustment signal and is capable of controlling said output clock signal in the clock period thereof by an increment(s) of a predetermined delay time on the basis of said delay time adjustment signal and outputting said output clock signal as controlled.

A further aspect of the present invention provides a multiplied clock generating circuit for generating and outputting an output clock signal that has a higher frequency than an input clock by a factor M, said multiplied clock generating circuit comprising: a frequency divider circuit which is configured to generate a feedback clock signal by dividing said output clock signal by a factor M; a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal; a register circuit which is configured to latch the output signal of said phase comparator circuit and to output, as a phase displacement signal, said output signal of said phase comparator circuit as latched in synchronism with said output clock signal; a phase control circuit which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a phase adjustment signal on the basis of the result of the comparison in the case where the same count of said feedback clock signal is maintained for a predetermined number of cycles; and a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, to output a delay time adjustment signal with reference to the result of the comparison if the phase adjustment signal is not given from said phase control circuit and to output a delay time adjustment signal when the number as counted of said feedback clock signal of each cycle of said feedback clock signal reaches the number as counted of said feedback clock signal in the cycle previous to said each cycle decremented by 1 if the phase adjustment signal is given from said phase control circuit; an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit.

A still further aspect of the present invention provides a multiplied clock generating circuit for generating and outputting an output clock signal that has a higher frequency than an input clock by a factor M, said multiplied clock generating circuit comprising: a frequency divider circuit which is configured to generate a feedback clock signal by dividing said output clock signal by a factor M; a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal; a register circuit which is configured to latch the output signal of said phase comparator circuit and to output, as a phase displacement signal, said output signal of said phase comparator circuit as latched in synchronism with said output clock signal; a frequency control circuit which is configured to receive said phase displacement signal outputted from said register circuit, said input clock signal and said feedback clock signal and to output first and second frequency control signals indicative of a predetermined width by which the clock period of said feedback clock signal is adjusted if the clock period of said feedback clock signal is longer than the clock period of said input clock signal by no smaller than a predetermined width; a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a delay time adjustment signal on the basis of the result of the comparison or the number as counted and said phase displacement signal outputted from said register circuit; an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit and said predetermined delay time if said first control signal is given from said frequency control circuit, and in order to shorten the clock period of said feedback clock signal on the basis of said second the control signal as given from said frequency control circuit.

A still further aspect of the present invention provides a multiplied clock generating circuit for generating and outputting an output clock signal that has a higher frequency than an input clock by a factor M, said multiplied clock generating circuit comprising: a frequency divider circuit which is configured to generate a feedback clock signal by dividing said output clock signal by a factor M; a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal; a register circuit which is configured to latch the output signal of said phase comparator circuit and to output, as a phase displacement signal, said output signal of said phase comparator circuit as latched in synchronism with said output clock signal; a phase control circuit which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a phase adjustment signal on the basis of the result of the comparison in the case where the same count of said feedback clock signal is maintained for a predetermined number of cycles; and a frequency control circuit which is configured to receive said phase displacement signal outputted from said register circuit, said input clock signal and said feedback clock signal and to output a frequency control signal if the clock period of said feedback clock signal is longer than the clock period of said input clock signal by no smaller than a predetermined width; a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, to output a delay time adjustment signal on the basis of the result of the comparison, and to maintain an initialized state thereof when a first control signal is given from said frequency control circuit; and an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit and said predetermined delay time if said first control signal is given from said frequency control circuit, and in order to shorten the clock period of said feedback clock signal on the basis of said second the control signal as given from said frequency control circuit.

BRIEF DESCRIPTION OF THE DRAWINGS

The aforementioned and other features and objects of the present invention and the manner of attaining them will become more apparent and the invention itself will be best understood by reference to the following description of various embodiments of the present invention taken in conjunction with the accompanying drawings, wherein:

FIG. 12 is a timing chart showing the output clock signal fo, the feedback clock signal fd, the output signal ctfup of the register 3-1, the output signal zfup of the comparator 4 and the control signal dlysw[3:0] in the case of the multiplied clock generating circuit in accordance with the embodiment of the present invention.

DETAILED DESCRIPTION OF THE INVENTION

In the followings, various embodiments of the present invention will be described with reference to the accompanying drawings.

Figure 6:
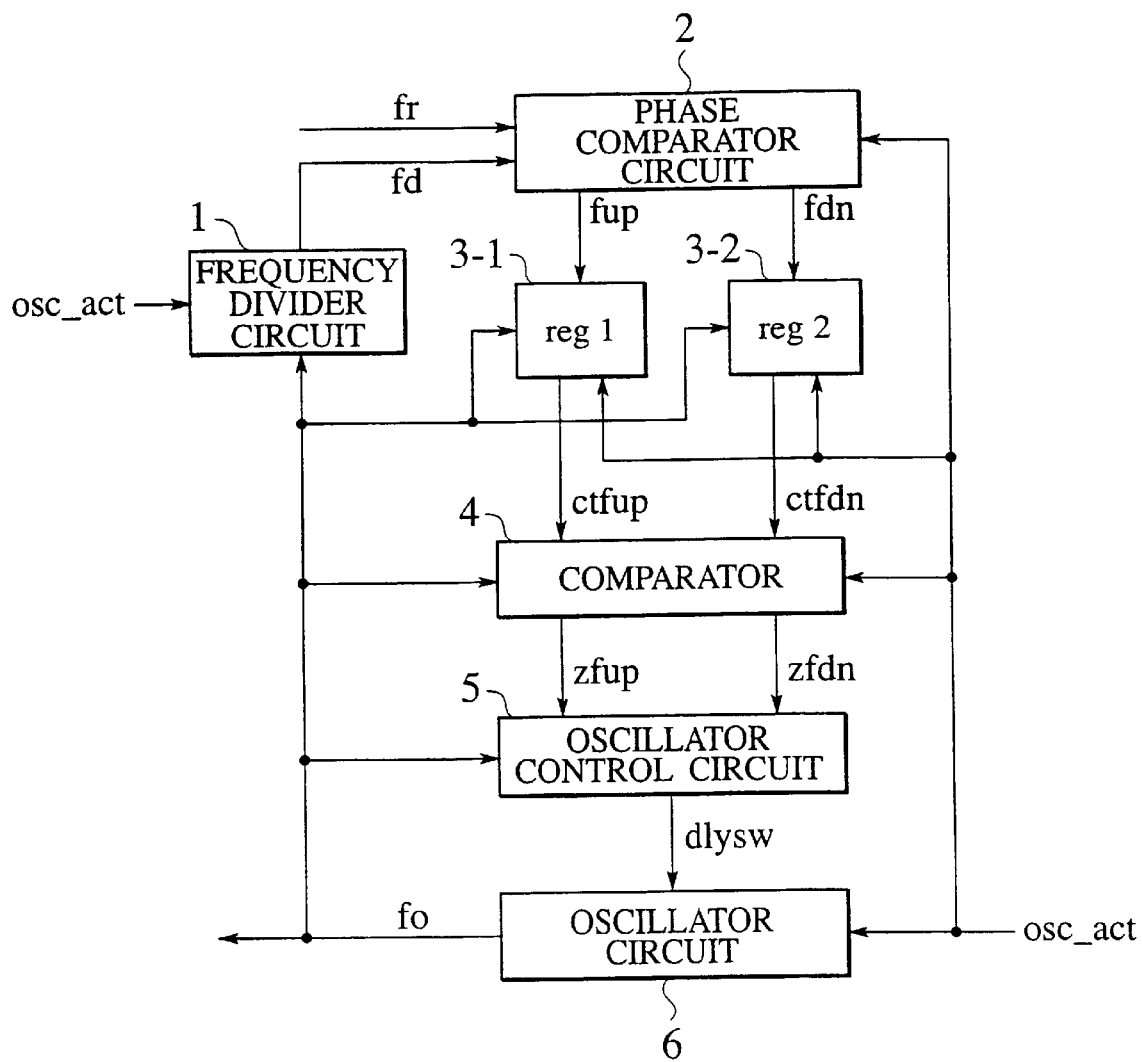
FIG. 6 is a schematic diagram showing a multiplied clock generating circuit in accordance with an embodiment of the present invention.

FIG. 6 is a schematic diagram showing a multiplied clock generating circuit designed as phase lock loop (PLL) circuitry in accordance with an embodiment of the present invention. In the figure, the multiplied clock generating circuit of the embodiment is composed of a frequency divider circuit 1, a phase comparator circuit 2, registers 3-1 and 3-2, a comparator 4, an oscillator control circuit 5 and an oscillator circuit 6. As explained later in details, it is possible to suppress the jitter of a feedback clock signal fd irrespective of the multiplication factor.

Figure 7:
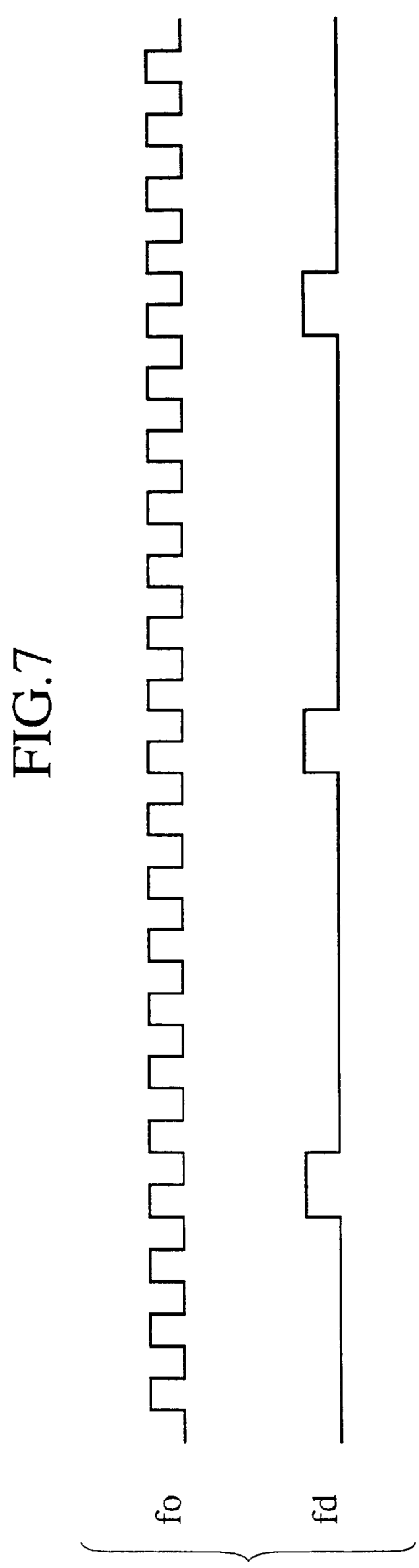
FIG. 7 is an exemplary timing chart showing the output clock signal fo and the feedback clock signal fd in the case where the output clock signal fo is frequency divided by the multiplication factor of 7 in the case of the multiplied clock generating circuit in accordance with the embodiment of the present invention.

In FIG. 6, the frequency divider circuit 1 serves to generate the feedback clock signal fd by dividing an output clock signal fo equally in synchronism with the output clock signal fo of the oscillator circuit 6. The frequency divider circuit 1 is reset to an initial state when the signal osc_act is set to a lower level. FIG. 7 is an exemplary timing chart showing the output clock signal fo and the feedback clock signal fd in the case where the output clock signal fo is frequency divided by the multiplication factor of 7.

The phase comparator circuit 2 serves to compare the phases of the input clock signal fr and the feedback clock signal fd at the rising edges of these clock signals, output an output signal fup activated to a high level and an output signal fdn deactivated to a low level when the rising edge of the feedback clock signal fd lags behind the rising edge of the input clock signal fr, and output an output signal fup deactivated to a low level and an output signal fdn activated to a high level when the rising edge of the feedback clock signal fd advances before the rising edge of the input clock signal fr. Otherwise, the phase comparator circuit 2 serves to output an output signal fup deactivated to a low level and an output signal fdn deactivated to a low level. The phase comparator circuit 2 is reset to an initial state if the input signal osc_act is set to a low level.

Figure 8:
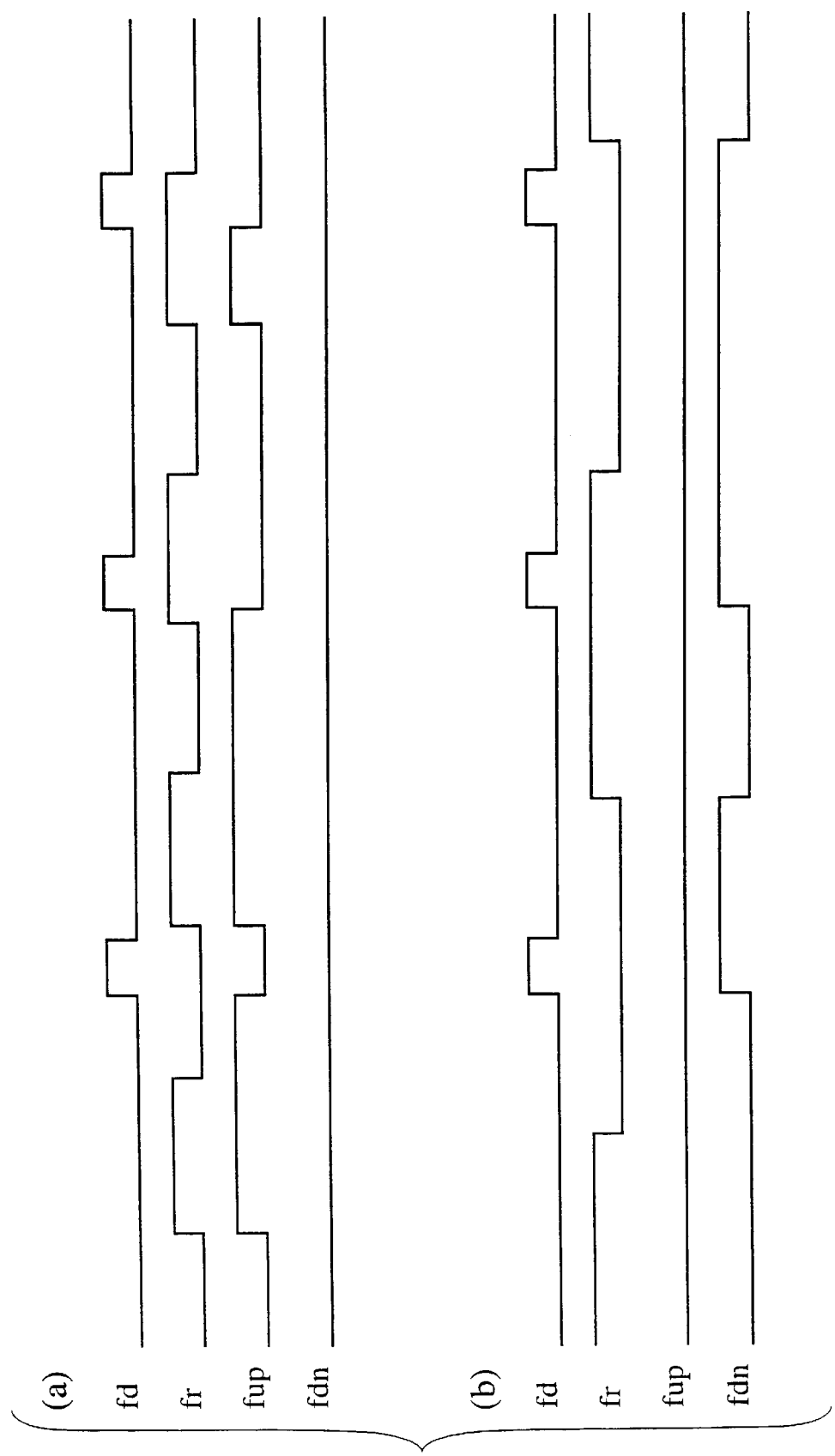
FIG. 8 is a timing chart showing the output signal of the phase comparator circuit in relation to the phase relationship between the input clock signal and the feedback clock signal.

FIG. 8 is a timing chart showing the output signal of the phase comparator circuit in relation to the phase relationship between the input clock signal and the feedback clock signal, in which FIG. 8(a) shows the timing of the output signal fup and the output signal fdn when the rising edge of the feedback clock signal fd lags behind the rising edge of the input clock signal fr; and FIG. 8(b) shows the timing of the output signal fup and the output signal fdn when the rising edge of the feedback clock signal fd advances before the rising edge of the input clock signal fr.

The registers (reg1, reg2) 3-1 and 3-2 serve to latch the output signals fup and fdn of the phase comparator circuit 2 in synchronism with the rising edge of the output clock signal fo and output the latched signals respectively as output signals ctfup and ctfdn. However, the output signals ctfup and ctfdn take "0" with the rising edge of the output clock signal fo with which the feedback clock signal fd is pulled up as a rising edge irrespective of the states of the output signal fup and the output signal fdn. This is because the rising edges of the output clock signal fo are counted for each cycle of the feedback clock signal fd by the comparator circuit 4 as described below. The registers 3-1 and 3-2 are reset when the input signal osc_act is set to a low level.

Figure 9:
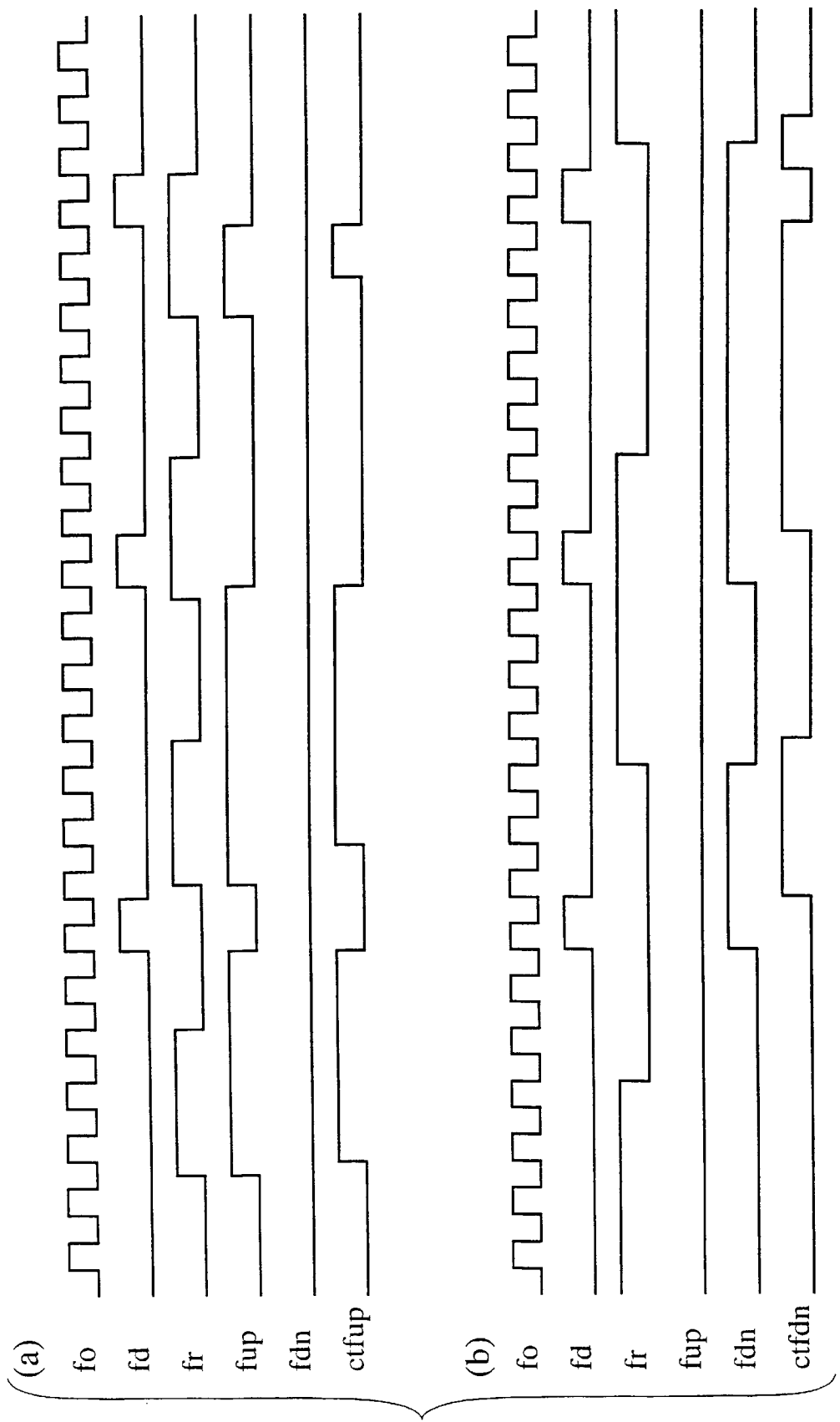
FIG. 9 is a timing chart showing the output signals fup and fdn of the phase comparator circuit 2 and the output signal ctfup of the register 3-1 in the case of the multiplied clock generating circuit in accordance with the embodiment of the present invention.

FIG. 9(a) is a graphic diagram showing the timing of the output signals fup and fdn of the phase comparator circuit 2 and the output signal ctfup of the register 3-1 when the rising edge of the feedback clock signal fd lags behind the rising edge of the input clock signal fr. Also FIG. 9(b) is a graphic diagram showing the timing of the output signals fup and fdn of the phase comparator circuit 2 and the output signal ctfdn of the register 3-1 when the rising edge of the feedback clock signal fd advances before the rising edge of the input clock signal fr.

The comparator circuit 4 serves to count the rising edges of the output clock signal fo within each cycle of the feedback clock signal fd while either the output signal ctfup or ctfdn of the registers 3-1 and 3-2 is in a high level, and to compare the current count with the previous count in the previous cycle of the feedback clock signal fd. If the output signal ctfup of the register 3-1 is in the high level at the time when the count of the rising edges of the output clock signal fo reaches the corresponding count of the previous cycle, the output signal zfup is pulled up to the high level (i.e., activated). Also, if the output signal ctfdn of the register 3-2 is in the high level at the time when the count of the rising edges of the output clock signal fo reaches the corresponding count of the previous cycle, the output signal zfdn is pulled up to the high level (i.e., activated). However, if both the output signal ctfdn of the register 3-2 and the output signal ctfup of the register 3-1 are in the low level through the previous cycle of the feedback clock signal fd, the output signal zfup or the output signal zfdn is pulled up when the count of the output clock signal fo in the current cycle of the feedback clock signal fd becomes "1". The output signal zfup is pulled down in synchronism with the first rising edge of the output clock signal fo after the output signal ctfup of the register 3-1 is pulled down. Also, the output signal zfdn is pulled down in synchronism with the first rising edge of the output clock signal fo after the output signal ctfdn of the register 3-2 is pulled down. The comparator 4 is reset when the signal osc_act is in the low level.

FIG. 10(a) shows the timing relationship among the output clock signal fo, the feedback clock signal fd, the output signal ctfup of the register 3-1 and the output signal zfup of the comparator 4 in the case where the phase of the feedback clock signal fd lags behind the phase of the input clock signal fr and where the count of the rising edges of the output clock signal fo increases as 3, 5 and 6 in succeeding cycles of the feedback clock signal fd with the output signal ctfup of the register 3-1 being in the high level. Also, FIG. 10(b) shows the timing relationship among the output clock signal fo, the feedback clock signal fd, the output signal ctfdn of the register 3-2 and the output signal zfdn of the comparator 4 in the case where the phase of the feedback clock signal fd advances before the phase of the input clock signal fr and where the count of the rising edges of the output clock signal fo increases as 3, 5 and 6 in succeeding cycles of the feedback clock signal fd with the output signal ctfdn of the register 3-2 being in the high level.

The oscillator control circuit 5 serves to count the rising edges of the output clock signal fo when both the output signal ctfup of the register 3-1 and the output signal zfup of the comparator 4 are in the high level or when both the output signal ctfdn of the register 3-2 and the output signal zfdn of the comparator 4 are in the high level. In the case where both the output signal ctfup of the register 3-1 and the output signal zfup of the comparator 4 are in the high level, the control signal dlysw given to the oscillator circuit 6 is adjusted in order that the clock period of the feedback clock signal fd is shortened by (the count×Δd×2) from the next cycle. Also, in the case where both the output signal ctfdn of the register 3-2 and the output signal zfdn of the comparator 4 are in the high level, the control signal dlysw given to the oscillator circuit 6 is adjusted in order that the clock period of the feedback clock signal fd is elongated by (the count× Δd×2) from the next cycle. However, if both the output signal ctfdn of the register 3-2 and the output signal ctfup of the register 3-1 are in the low level through the previous cycle of the feedback clock signal fd, the rising edges of the output clock signal fo is counted from the edge at which the output signal zfup or the output signal zfdn is pulled up.

Figure 10:
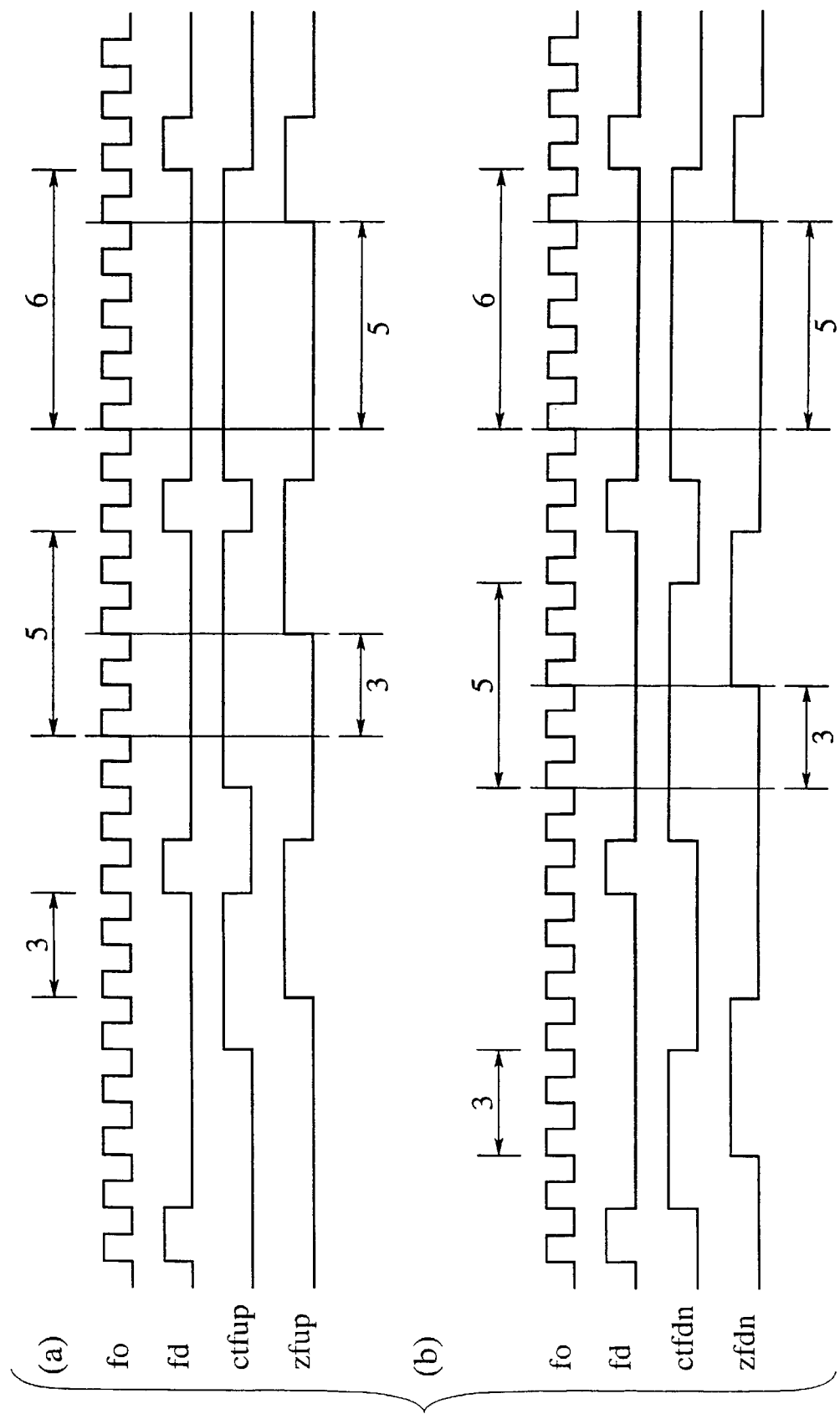
FIG. 10 shows the timing relationship among the output clock signal fo, the feedback clock signal fd, the output signal ctfup of the register 3-1 and the output signal zfup of the comparator in the case of the multiplied clock generating circuit in accordance with the embodiment of the present invention.
Figure 11:
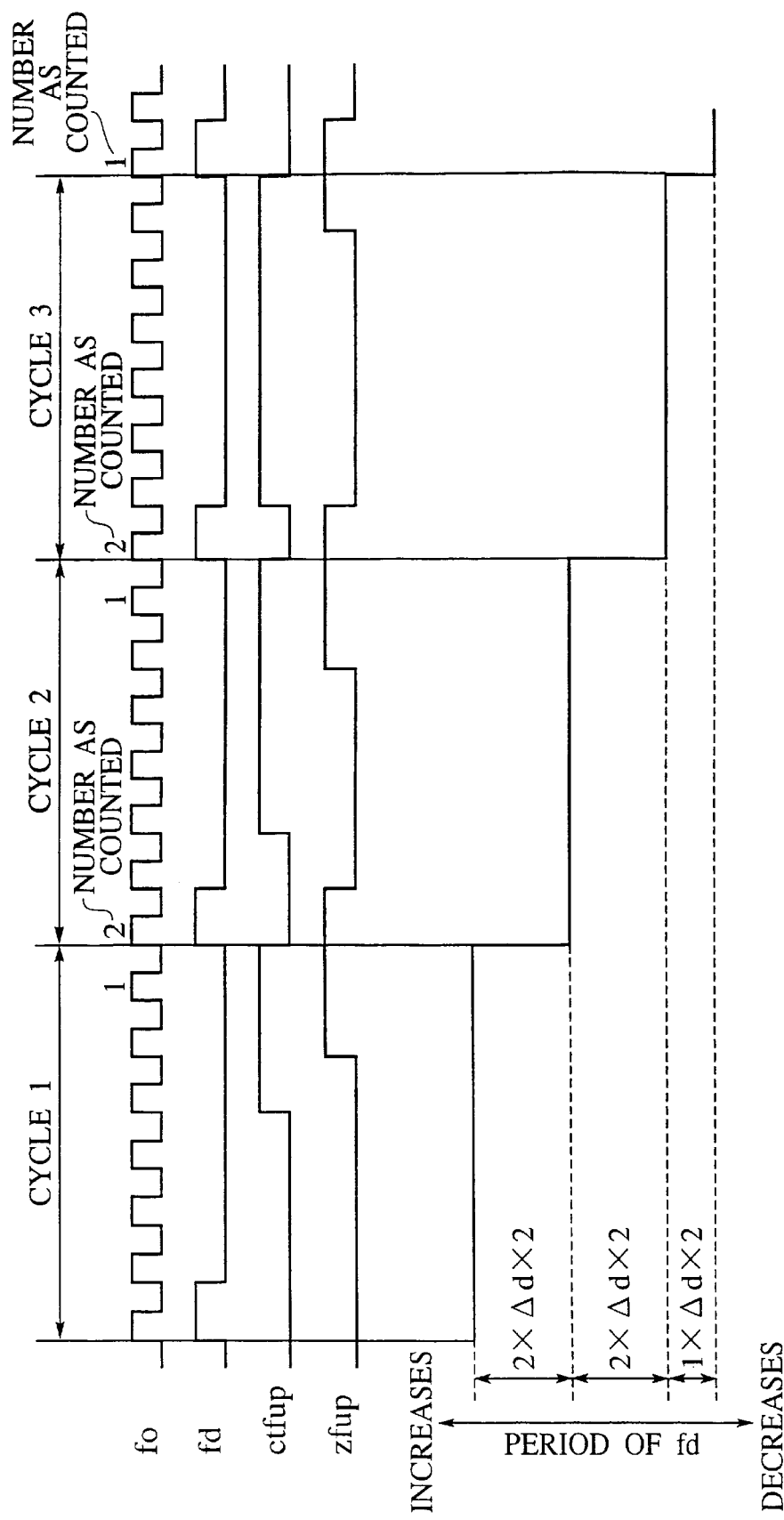
FIG. 11 is a timing chart showing the variation of the clock period of the feedback clock signal fd in the case of the multiplied clock generating circuit in accordance with the embodiment of the present invention.

FIG. 11 is a timing chart showing the variation of the clock period of the feedback clock signal fd in the exemplary timing as illustrated in FIG. 10($a$). In FIG. 11, the count of the rising edges of the output clock signal fo is "2" when both the output signal ctfup of the register 3-1 and the output signal zfup of the comparator 4 are in the high level in the cycle 1 and the cycle 2 of the feedback clock signal fd, and therefore the clock period of the feedback clock signal fd is shortened by (2×Δd×2) in the next cycle of the feedback clock signal fd (i.e., the cycle 2 or the cycle 3). Also, the count of the rising edges of the output clock signal fo is "1" are in the high level in the cycle 3 of the feedback clock signal fd, and therefore the clock period of the feedback clock signal fd is shortened by (1×Δd×2) in the next cycle of the feedback clock signal fd.

Figure 2:
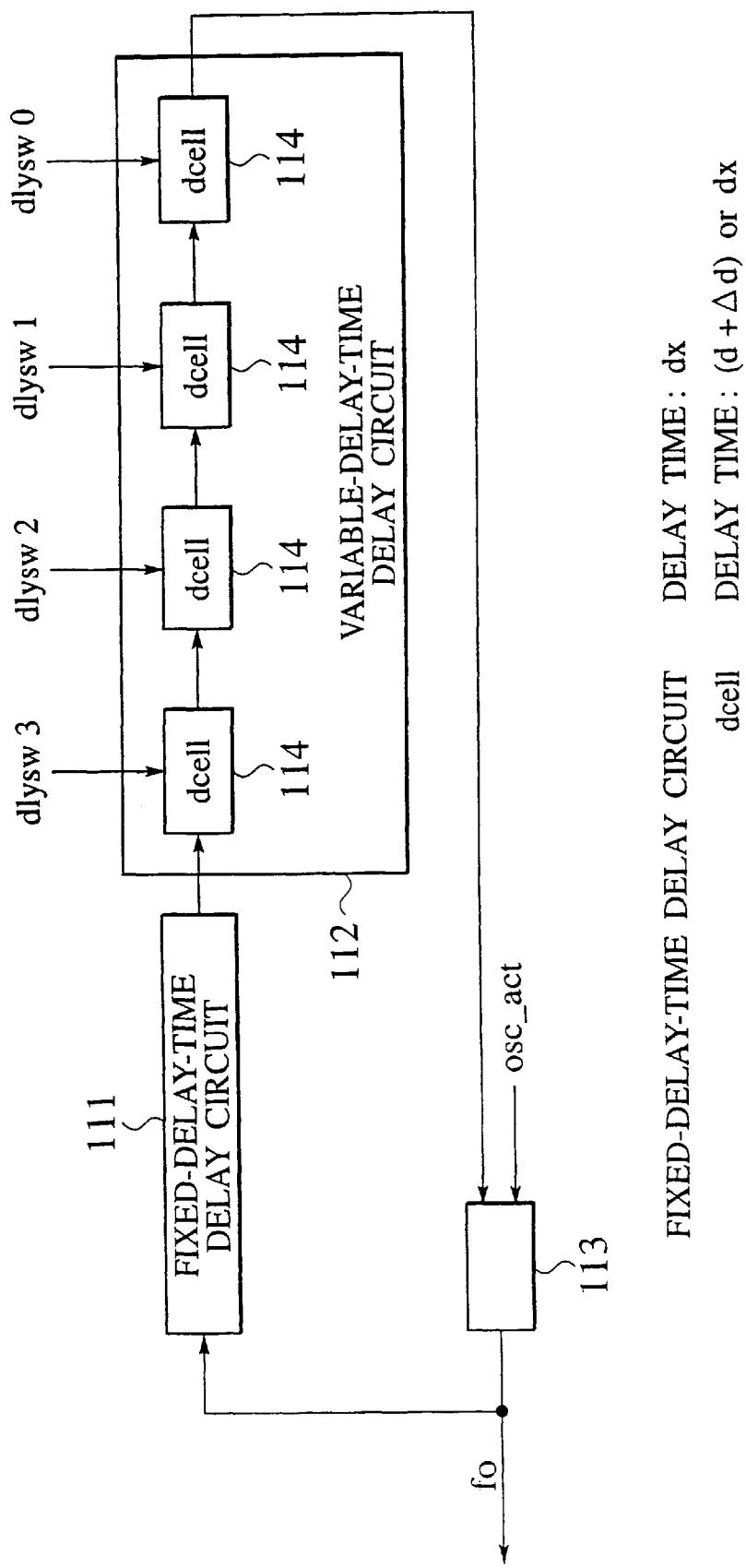
FIG. 2 is a schematic diagram showing an example of the configuration of the oscillator circuit for use in a multiplied clock generating circuit.
Figure 3:
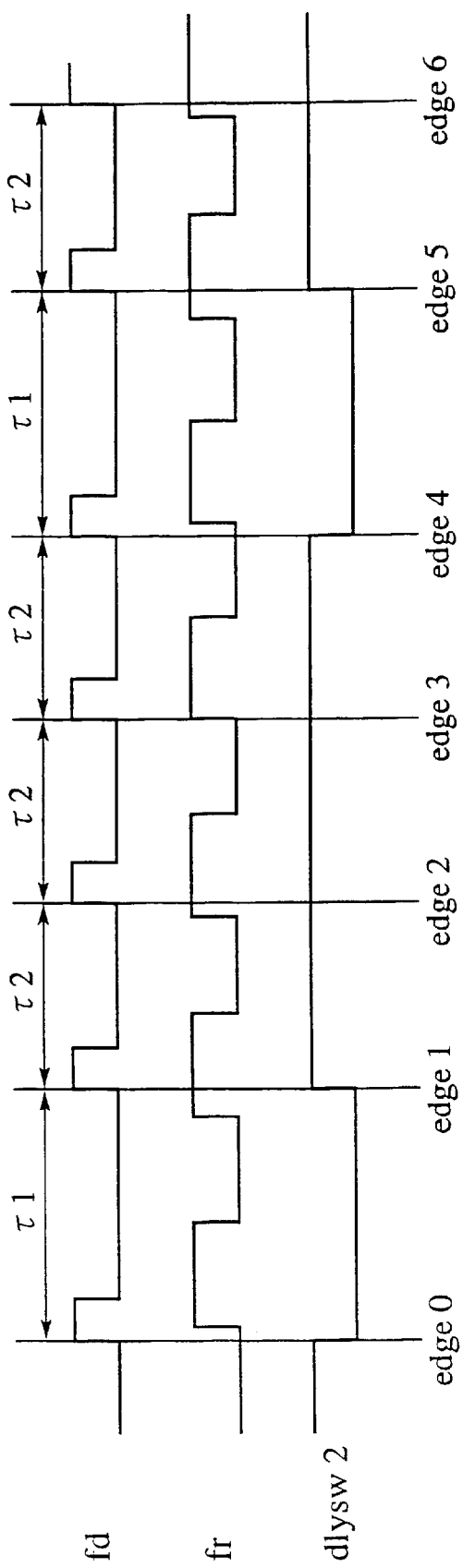
FIG. 3 is an exemplary timing chart showing the control signal of the oscillator control circuit.
Figure 4:
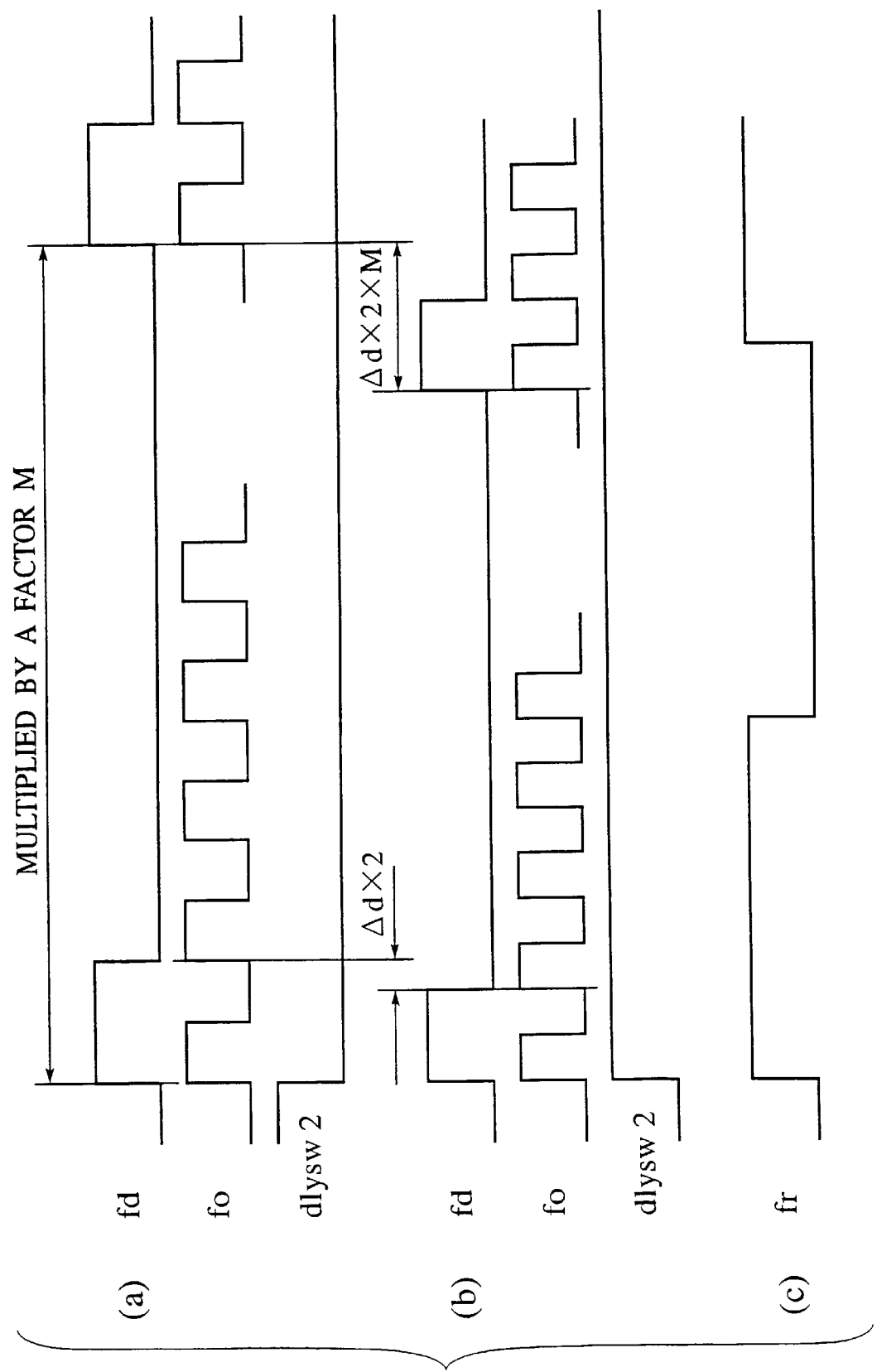
FIG. 4 is a timing chart showing the relationship among the feedback clock signal fd, the output clock signal fo, the signal dlysw2 and the input clock signal fr.
Figure 5:
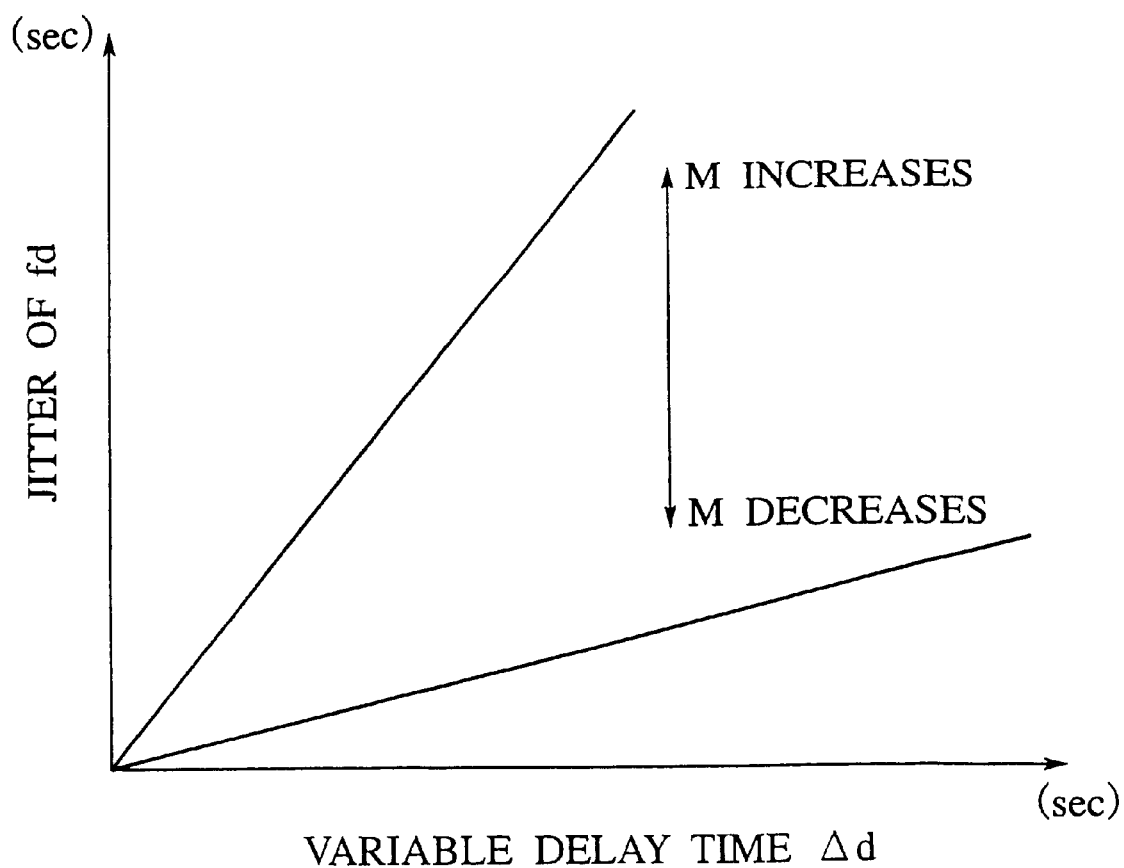
FIG. 5 is a graphic diagram showing the relationship between the jitter of the feedback clock signal fd and the jitter of the variable delay with reference to the multiplication factor M.

The oscillator circuit 6 is designed, for example, as illustrated in FIG. 2 and composed of a plurality of variable-delay-time delay circuits 112 each of which is capable of adjusting the delay time with the difference Δd on the basis of the control signal dlysw as given from the oscillator control circuit 5, a fixed-delay-time delay circuit 111 whose delay time is dx satisfying the equation tx<dx where tx is equal to the time period from a rising edge of the output clock signal fo as the output signal of the oscillator circuit 6 to the time when the control signal dlysw of the variable-delay-time delay circuit 112 becomes available, and an oscillation control circuit 113 serving to activate the oscillator circuit 6 to oscillate when the signal osc_act is in the high level and to deactivate the oscillator circuit 6 when the signal osc_act is in the low level.

In FIG. 2, the control signal dlysw is a four-bit signal (dlysw0 to dlysw3) while each delay cell (dcell) 114 as a component of the variable-delay-time delay circuit 112 gives a delay time of (d+Δd) to the input signal thereto when the control signal dlysw*(*=0 to 3) is in the low level and a delay time of d to the input signal thereto when the control signal dlysw*(*=0 to 3) is in the high level. Meanwhile, in the illustration of FIG. 2, the variable-delay-time delay circuit 112 is composed of four delay cells 114 for the sake of clarity in explanation. However, in an actual case, the variable-delay-time delay circuit 112 is composed of a more large number of delay cells 114. The output signal of the oscillator circuit 6 therefore takes on values in the clock period $$[dx+4\times(d+\Delta d)]\times 2 \sim [dx+4\times d]\times 2.$$

The delay time can be controlled within the above range with a unit of (Δd×2).

Figure 13:
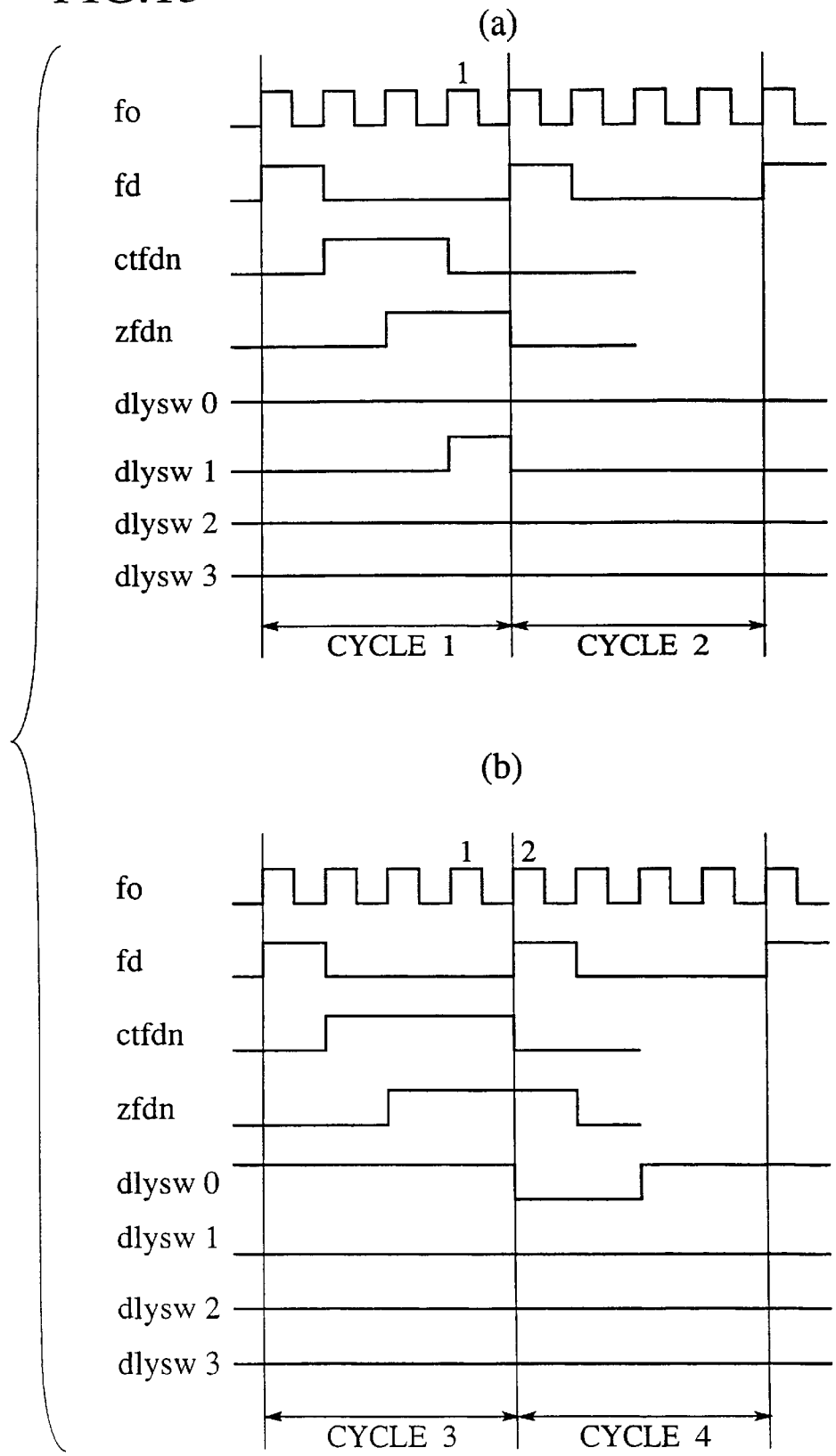
FIG. 13 is a timing chart showing the output clock signal fo, the feedback clock signal fd, the output signal ctfdn of the register 3-2 and the control signal dlysw[3:0] in the case that the multiplication factor is 4 in accordance with the embodiment of the present invention.

FIG. 12 is a timing chart showing the output clock signal fo, the feedback clock signal fd, the output signal ctfup of the register 3-1, the output signal zfup of the comparator 4 and the control signal dlysw[3:0] in the case that the multiplication factor is 4. FIG. 13 is a timing chart showing the output clock signal fo, the feedback clock signal fd, the output signal ctfdn of the register 3-2 and the control signal dlysw[3:0] in the case that the multiplication factor is 4. FIG. 12($a$) illustrates the variation of the respective signals from the cycle 1 to the cycle 2. The number of the cycles of the output clock signal fo is "2" while all the control signal dlysw[3:0] are in the low level in the cycle 1. Also, the number of the cycles of the output clock signal fo is "2" while only the control signal dlysw0 is in the high level in the cycle 1. On the other hand, the count of the rising edges within the cycle 1 is "1" while both the output signal ctfup of the register 3-1 and the output signal zfup of the comparator 4 are in the high level. In the cycle 2, therefore, the number of the cycles of the output clock signal fo is "1" while all the control signal dlysw[3:0] are in the low level; and the number of the cycles of the output clock signal fo is "3" while only the control signal dlysw0 is in the high level.

In FIG. 12($a$), the clock period of the feedback clock signal fd in the cycle 1 is $$[[dx+4\times(d+\Delta d)]\times 2]\times 2+[[dx+3\times(d+\Delta d)+d]\times 2]\times 2$$

while the clock period of the feedback clock signal fd in the cycle 2 is $$[[dx+4\times(d+\Delta d)]\times 2]\times 1+[[dx+3\times(d+\Delta d)+d]\times 2]\times 3.$$

Accordingly, the differential time between the clock periods in the cycle 1 and the cycle 2 of the feedback clock signal fd is then (Δd×2×1).

FIG. 12($b$) illustrates the variation of the respective signals from the cycle 3 to the cycle 4. The number of the cycles of the output clock signal fo is "1" while all the control signal dlysw[3:0] are in the low level in the cycle 3. Also, the number of the cycles of the output clock signal fo is "3" while only the control signal dlysw0 is in the high level in the cycle 3. On the other hand, the count of the rising edges within the cycle 3 is "2" while both the output signal ctfup of the register 3-1 and the output signal zfup of the comparator 4 are in the high level. In the cycle 4, therefore, the number of the cycles of the output clock signal fo is "3" while only the control signal dlysw0 is in the high level; and the number of the cycles of the output clock signal fo is "1" while the control signal dlysw0 and the control signal dlysw1 are in the high level.

In FIG. 12($b$), the clock period of the feedback clock signal fd in the cycle 3 is $$[[dx+4\times(d+\Delta d)]\times 2]\times 1+[[dx+3\times(d+\Delta d)+d]\times 2]\times 3$$

while the clock period of the feedback clock signal fd in the cycle 4 is $$[[dx+3\times(d+\Delta d)+d]\times 2]\times 3+[[dx+2\times(d+\Delta d)+2\times d]\times 2]\times 1.$$

Accordingly, the differential time between the clock periods in the cycle 3 and the cycle 4 of the feedback clock signal fd is then (Δd×2×2).

FIG. 13($a$) illustrates the variation of the respective signals from the cycle 1 to the cycle 2. The number of the cycles of the output clock signal fo is "3" while only the control signal dlysw0 is in the high level in the cycle 1. Also, the number of the cycles of the output clock signal fo is "1" while the control signal dlysw0 and the control signal dlysw1 are in the high level in the cycle 1. On the other hand, the count of the rising edges within the cycle 1 is "1" while both the output signal ctfdn of the register 3-2 and the output signal zfdn of the comparator 4 are in the high level. In the cycle 2, therefore, the number of the cycles of the output clock signal fo is "4" while only the control signal dlysw0 is in the high level.

In FIG. 13(a), the clock period of the feedback clock signal fd in the cycle 1 is $$[[dx+3\times(d+\Delta d)+d]\times 2]\times 3+[[dx+2\times(d+\Delta d)+2\times d]\times 2]\times 1$$

while the clock period of the feedback clock signal fd in the cycle 2 is $$[[dx+3\times(d+\Delta d)+d]\times 2]\times 4.$$

Accordingly, the differential time between the clock periods in the cycle 1 and the cycle 2 of the feedback clock signal fd is then ($\Delta d\times 2\times 1$).

FIG. 13(b) illustrates the variation of the respective signals from the cycle 3 to the cycle 4. The number of the cycles of the output clock signal fo is "4" while only the control signal dlysw0 is in the high level in the cycle 3. On the other hand, the count of the rising edges within the cycle 3 is "2" while both the output signal ctfdn of the register 3-2 and the output signal zfdn of the comparator 4 are in the high level. In the cycle 4, therefore, the number of the cycles of the output clock signal fo is "2" while all the control signal dlysw[3:0] are in the low level; and the number of the cycles of the output clock signal fo is "2" while only the control signal dlysw0 is in the high level.

In FIG. 13(b), the clock period of the feedback clock signal fd in the cycle 3 is $$[[dx+3\times(d+\Delta d)+d]\times 2]\times 4$$

while the clock period of the feedback clock signal fd in the cycle 4 is $$[[dx+4\times(d+\Delta d)]\times 2]\times 2+[[dx+3\times(d+\Delta d)+d]\times 2]\times 2.$$

Accordingly, the differential time between the clock periods in the cycle 3 and the cycle 4 of the feedback clock signal fd is then ($\Delta d\times 2\times 2$).

Next, the convergence of the feedback clock signal fd in the configuration as illustrated in FIG. 6 will be explained.

It is assumed that the clock period of the clock signal fr is frt; that the clock period of the feedback clock signal fd is fdt; and that the clock period of the oscillation of the oscillator circuit 6 is fot as the output clock signal fo. Then, if fot≦|frt−fdt|, it will be easily understood that the relationship is changed in time as fot>|frt−fdt| without changing the magnitude relation between the clock period frt of the input clock signal fr and the clock period fdt of the feedback clock signal fd.

On the other hand, after the magnitude relation of fot>|frt−fdt| is realized, the oscillator control circuit 5 serves to adjust the control signal dlysw in order to shorten the differential period between the clock period frt of the input clock signal fr and the clock period fdt of the feedback clock signal fd, only when the accumulated error Σerr=Σ|frt−fdt| satisfies fot≦Σerr. After repeating such operation, the magnitude relation satisfies in the case where frt>fdt $$frt \leq fdt < frt+\Delta d\times 2.$$

Also, in the case where frt<fdt, the magnitude relation satisfies $$frt-\Delta d\times 2 < fdt \leq frt.$$

In this case, if the clock period frt of the input clock signal fr is equal to the clock period fdt of the feedback clock signal fd, the instant condition is stably maintained unless the relationship the clock period frt of the input clock signal fr and the clock period fdt of the feedback clock signal fd is destroyed by some external disturbance. On the other hand, the phase relationship between the input clock signal fr and the feedback clock signal fd is inverted in time if $$frt < fdt < frt+\Delta d\times 2 \text{ or}$$

$$frt-\Delta d\times 2 < fdt < frt.$$

Also, the control signal dlysw is adjusted if $$frt < fdt < frt+\Delta d\times 2$$

in order to shorten the clock period fdt of the feedback clock signal fd by ($\Delta d\times 2$) when the relationship fot≦Σer is satisfied with Σer being counted after inversion of the phase relationship. Furthermore, the control signal dlysw is adjusted if $$frt-\Delta d\times 2 < fdt < frt$$

in order to elongate the clock period fdt of the feedback clock signal fd by ($\Delta d\times 2$), when the relationship fot≦Σer is satisfied with Σer being counted after inversion of the phase relationship, and therefore satisfy $$frt < fdt < frt+\Delta d\times 2.$$

Thereafter, the above operation is repeated and therefore the clock period fdt of the feedback clock signal fd alternately takes either of two values within the range satisfying $$frt-\Delta d\times 2 < fdt < frt+\Delta d\times 2.$$

in each cycle of the feedback clock signal fd unless the relationship the clock period frt of the input clock signal fr and the clock period fdt of the feedback clock signal fd is destroyed by some external disturbance. The jitter of the output clock signal fo is then ($\Delta d\times 2$) which is not depending on the multiplication factor.

Also, if the multiplication factor is M and frt÷M=fot_trg, the clock period fot of the output clock signal fo takes either of two values within the range satisfying $$fot\_trg-\Delta d\times 2 < fot < fot\_trg+\Delta d\times 2.$$

The jitter of the output clock signal fo is then ($\Delta d\times 2$) which is not depending on the multiplication factor like the jitter of the feedback clock signal fd.

Figure 14:
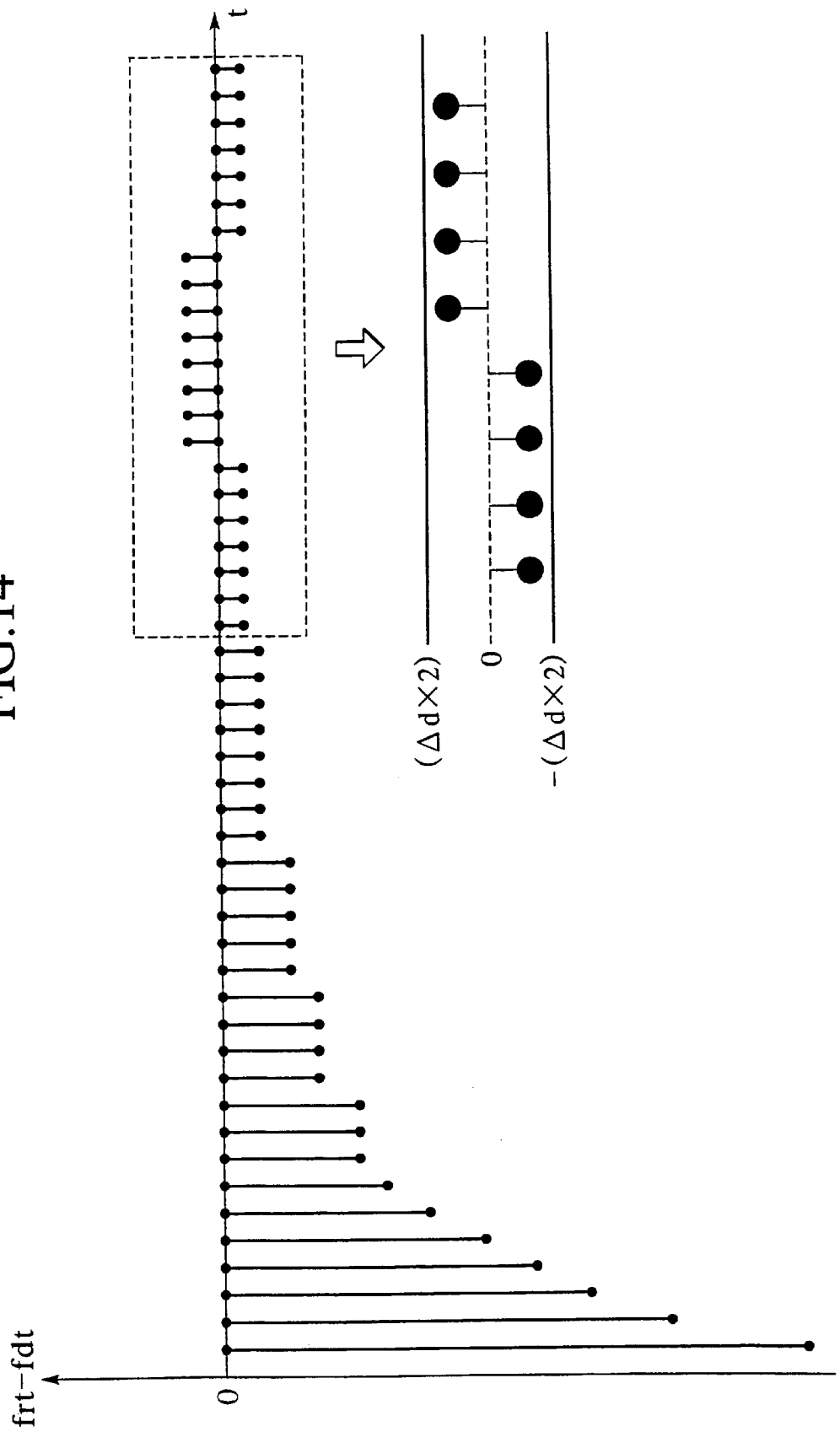
FIG. 14 shows one example of transition in time of (the clock period of the input clock signal—the clock period of the feedback clock signal) in the case of the multiplied clock generating circuit in accordance with the embodiment of the present invention.

FIG. 14 shows one example of transition in time of (frt−fdt) where the clock period fdt of the feedback clock signal fd converges at two values within the range satisfying $$frt-\Delta d\times 2 < fdt < frt+\Delta d\times 2.$$

Figure 15:
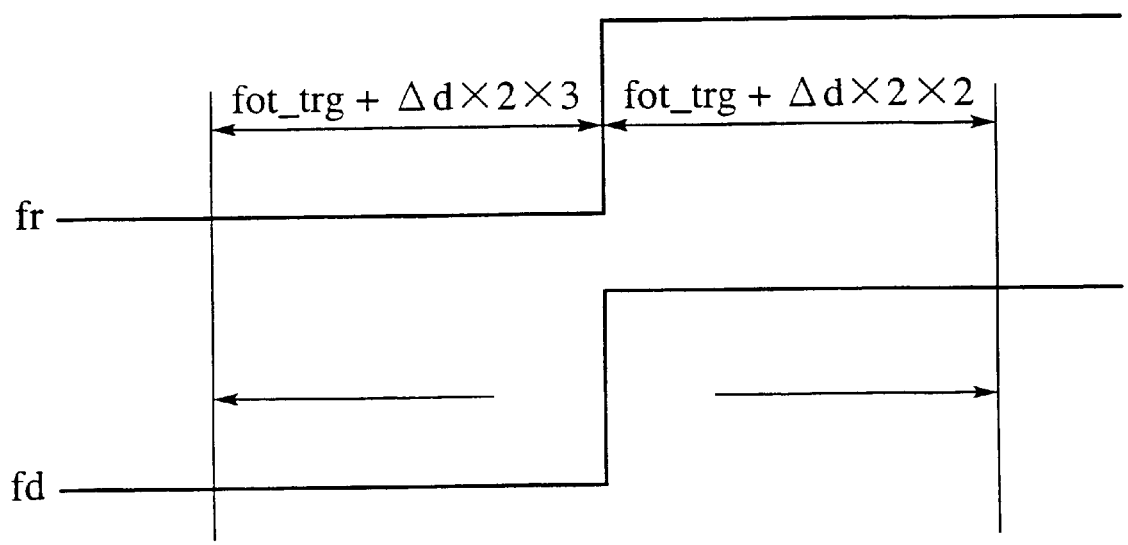
FIG. 15 is a timing chart showing the positional relationship of the rising edges of the input clock signal fr and the feedback clock signal fd in the case of the multiplied clock generating circuit in accordance with the embodiment of the present invention.

FIG. 15 is a timing chart showing the positional relationship of the rising edges of the input clock signal fr and the feedback clock signal fd after the clock period fdt of the feedback clock signal fd has converged at two values within the range satisfying $$frt-\Delta d\times 2 < fdt < frt+\Delta d\times 2.$$

In the case of the above described embodiment as described above, the condition of the multiplied clock generating circuit is locked in order that the clock period fdt of the feedback clock signal fd is equal to the clock period frt of the input clock signal fr or has converged at two values within the range satisfying $$frt-\Delta d \times 2 < fdt < frt + \Delta d \times 2.$$

Figure 16:
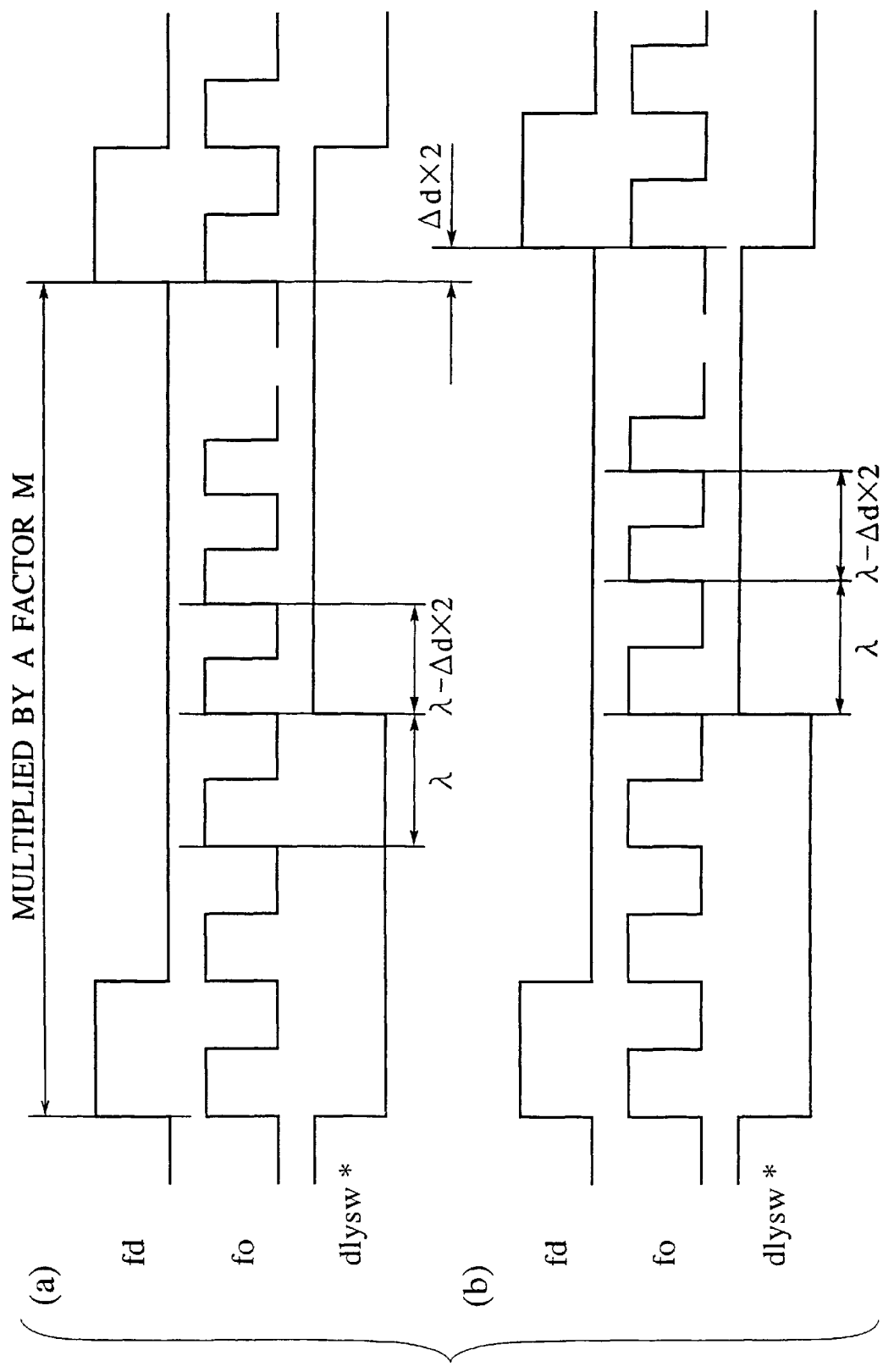
FIG. 16 is a timing chart showing the jitter of the feedback clock signal in the case of the multiplied clock generating circuit in accordance with the embodiment of the present invention.

In the later case, as illustrated in FIG. 16, the maximum jitters of the feedback clock signal fd and the output clock signal fo is ($\Delta d \times 2$) irrespective of the multiplication factor M and therefore the displacement between the rising edge of the input clock signal fr and the rising edge of the feedback clock signal fd does not exceed $$fot\_trg + \Delta d \times 2 \times 3.$$

Next, another embodiment of the present invention will be explained.

Figure 17:
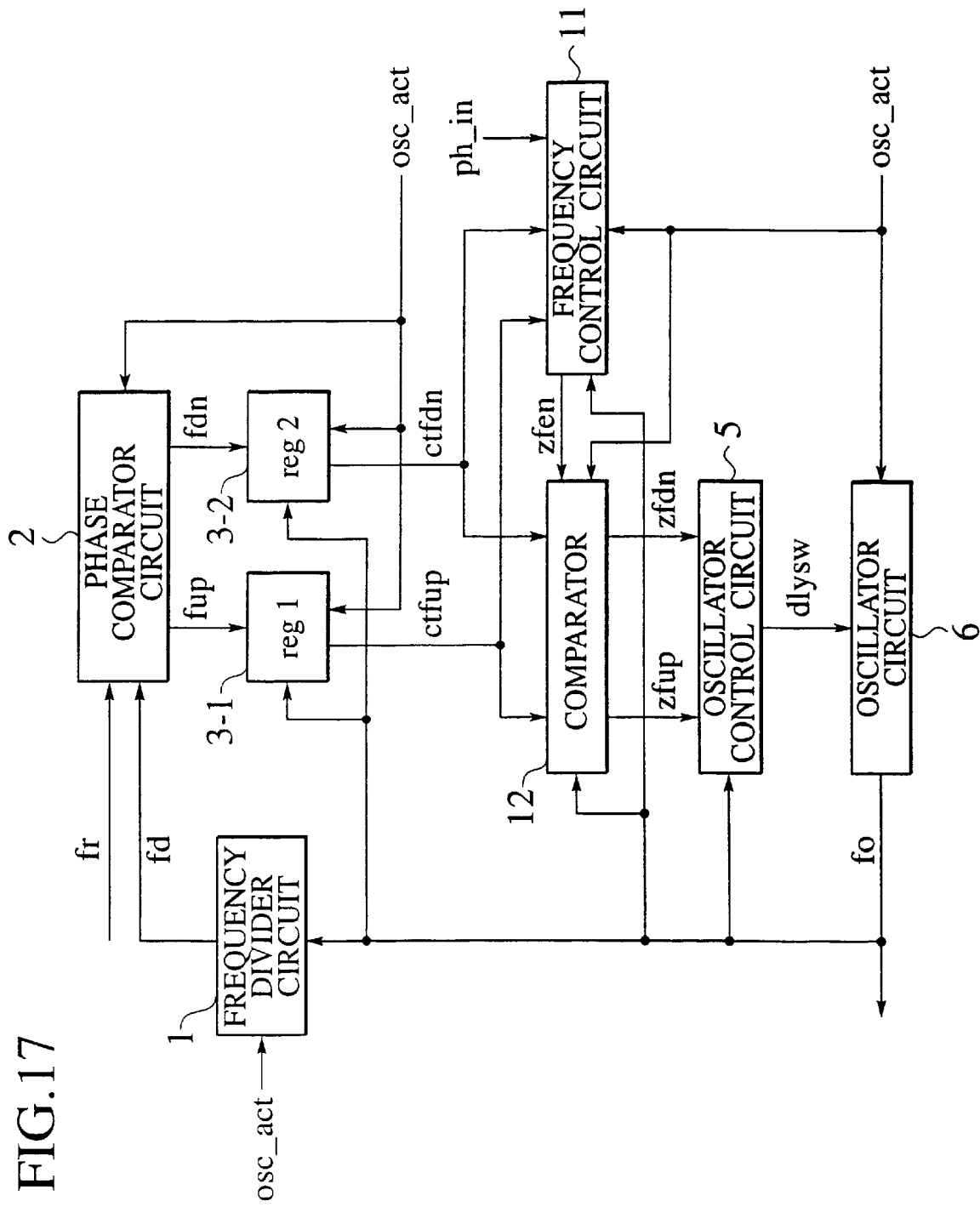
FIG. 17 is a timing chart showing a multiplied clock generating circuit in accordance with another embodiment of the present invention.

FIG. 17 is a timing chart showing a multiplied clock generating circuit in accordance with this embodiment of the present invention. In FIG. 17, the multiplied clock generating circuit of this embodiment is constructed in the same manner as the multiplied clock generating circuit as illustrated in FIG. 6 except for provision of a phase control circuit 11 and a comparator 12 in place of the comparator 4 as illustrated in FIG. 6.

The operation of the comparator 12 is equivalent to the operation of the comparator 4 in the case where the output signal zfen as given from the phase control circuit 11 is in a low level. However, in the case where the signal zfen is in a high level, the comparator 12 serves to pull up the output signal zfup or the output signal zfdn if the count of the rising edges of the output clock signal fo is smaller than the previous count in the preceding cycle of the feedback clock signal fd by "1" while the output signal ctfup of the register 3-1 or the output signal ctfdn of the register 3-2 is pulled up.

The phase control circuit 11 serves to compare, in each cycle, the count of the rising edges of the output clock signal fo in the current cycle and the previous count in the preceding cycle of the feedback clock signal fd as counted when the output signal ctfup of the register 3-1 or the output signal ctfdn of the register 3-2 is pulled up. When the counts of the rising edges as compared does not vary through n successive cycles where n is an arbitary integer as designated by a signal ph_in, the phase control circuit 11 serves to pull up the output signal zfen from a low level to a high level in synchronism with the rising edges of the next feedback clock signal fd and pull down from a high level to a low level in synchronism with the rising edges of the feedback clock signal fd subsequent to said next feedback clock signal fd. The phase control circuit 11 is reset to the initial state when the signal osc_act is in the low level.

In the case of the embodiment as illustrated in FIG. 6, when the condition of the multiplied clock generating circuit is locked in the order that the clock period fdt of the feedback clock signal fd takes on two values within the range satisfying $$frt-\Delta d \times 2 < fdt < frt + \Delta d \times 2,$$

the phase relationship between the input clock signal fr and the feedback clock signal fd is as illustrated in FIG. 15. However, when the condition of the multiplied clock generating circuit is locked in order that the clock period fdt of the feedback clock signal fd is equal to the clock period frt of the input clock signal fr, the phase relationship between the input clock signal fr and the feedback clock signal fd is indeterminate.

It may be therfore the case that the phase relationship between the input clock signal fr and the feedback clock signal fd is substantially changed when the clock period fdt of the feedback clock signal fd is unlocked by some environmental change from the condition to take on two values within the range satisfying $$frt-\Delta d \times 2 < fdt < frt + \Delta d \times 2,$$

and locked again in order that the clock period fdt of the feedback clock signal fd is equal to the clock period frt of the input clock signal fr, or when the clock period fdt of the feedback clock signal fd is unlocked from the condition that the clock period fdt of the feedback clock signal fd is equal to the clock period frt of the input clock signal fr, and locked again in order that the clock period fdt of the feedback clock signal fd takes on two values within the range satisfying $$frt-\Delta d \times 2 < fdt < frt + \Delta d \times 2.$$

Figure 18:
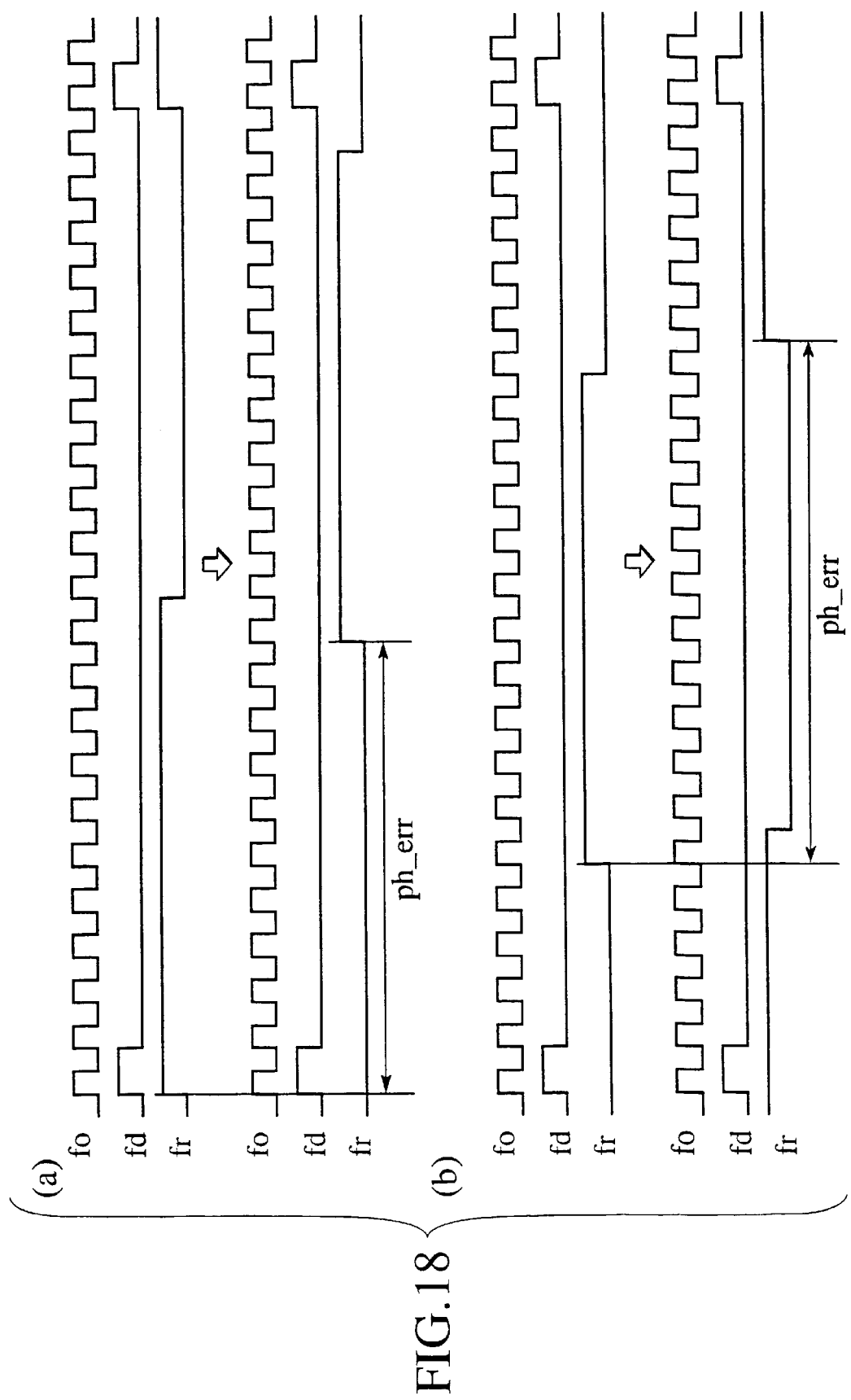
FIG. 18 is a timing chart showing an exemplary timing of the transition in the locking condition of the clock period fdt of the feedback clock signal fd with reference to the output clock signal in the case of the multiplied clock generating circuit in accordance with said another embodiment of the present invention.

FIG. 18 is a timing chart showing an exemplary timing of the transition in the locking condition of the clock period fdt of the feedback clock signal fd from the condition taking on two values within the range satisfying $$frt-\Delta d \times 2 < fdt < frt + \Delta d \times 2,$$

to the condition that the clock period fdt of the feedback clock signal fd is equal to the clock period frt of the input clock signal fr. Also FIG. 18(b) is a schematic diagram showing an exemplary timing of the transition in the locking condition of the clock period fdt of the feedback clock signal fd, in which the clock period fdt of the feedback clock signal fd is equal to the clock period frt of the input clock signal fr followed by unlocking the condition, and thereafter locked again in order that the clock period fdt of the feedback clock signal fd is equal to the clock period frt of the input clock signal fr. In FIG. 18(a) and FIG. 18(b), the resultant phase displacement is indicated with ph_err.

From the above explanation, it is understood that, while the improved mechanism of the multiplied clock generating circuit as illustrated in FIG. 6 is applicable to such a multiplied clock generating circuit as simply requires a times-M clock signal without taking into consideration any phase displacement as described above, but is not applicable to such a multiplied clock generating circuit in which a phase displacement has to be taken into consideration.

Contrary to this, in accordance with this embodiment, the feedback clock signal fd is controlled, when locked, in order that the clock period fdt of the feedback clock signal fd satisfies $$frt-\Delta d \times 2 \times k < fdt < frt + \Delta d \times 2 \times k$$

where k is an arbitary integer. Furthermore, in accordance with this embodiment, when the count of the rising edges of the output clock signal fo is "1" or more while the output signal ctfup of the register 3-1 or the output signal ctfdn of the register 3-2 is pulled up to the high level, the feedback clock signal fd is controlled in order not to be locked in the condition that the clock period fdt of the feedback clock signal fd is equal to the clock period frt of the input clock signal fr and therefore it is possible to remove the above described shortcoming that the phase is displaced.

The above described shortcoming originates from the case where the feedback clock signal fd is locked in the condition that the clock period frt of the input clock signal fr is equal to the clock period fdt of the feedback clock signal fd while the count of the rising edges of the output clock signal fo is "1" or more while the output signal ctfup of the register 3-1 or the output signal ctfdn of the register 3-2 is pulled up to the high level.

In the case of this embodiment, therefore, if the feedback clock signal fd is locked for n cycles in the same condition that the count of the rising edges of the output clock signal fo is "1" or more while the output signal ctfup of the register 3-1 or the output signal ctfdn of the register 3-2 is pulled up to the high level, the phase control circuit 11 serves to pull up the output signal zfen from a low level to a high level in synchronism with the rising edges of the next feedback clock signal fd. Also, in the cycles of the feedback clock signal fd, the clock period fdt of the feedback clock signal fd is adjusted in order to decrement the count of the rising edges of the output clock signal fo if the count of the rising edges of the output clock signal fo as counted while the output signal ctfup of the register 3-1 or the output signal ctfdn of the register 3-2 is pulled up to the high level is no less than the corresponding count of the rising edges in the previous cycle. By this configuration, in the phase relationship in which the count of the rising edges of the output clock signal fo is "1" or more while the output signal ctfup of the register 3-1 or the output signal ctfdn of the register 3-2 is pulled up to the high level, the clock period fdt of the feedback clock signal fd is prevented from being locked in the condition that the clock period frt of the input clock signal fr is equal to the clock period fdt of the feedback clock signal fd.

Figure 19:
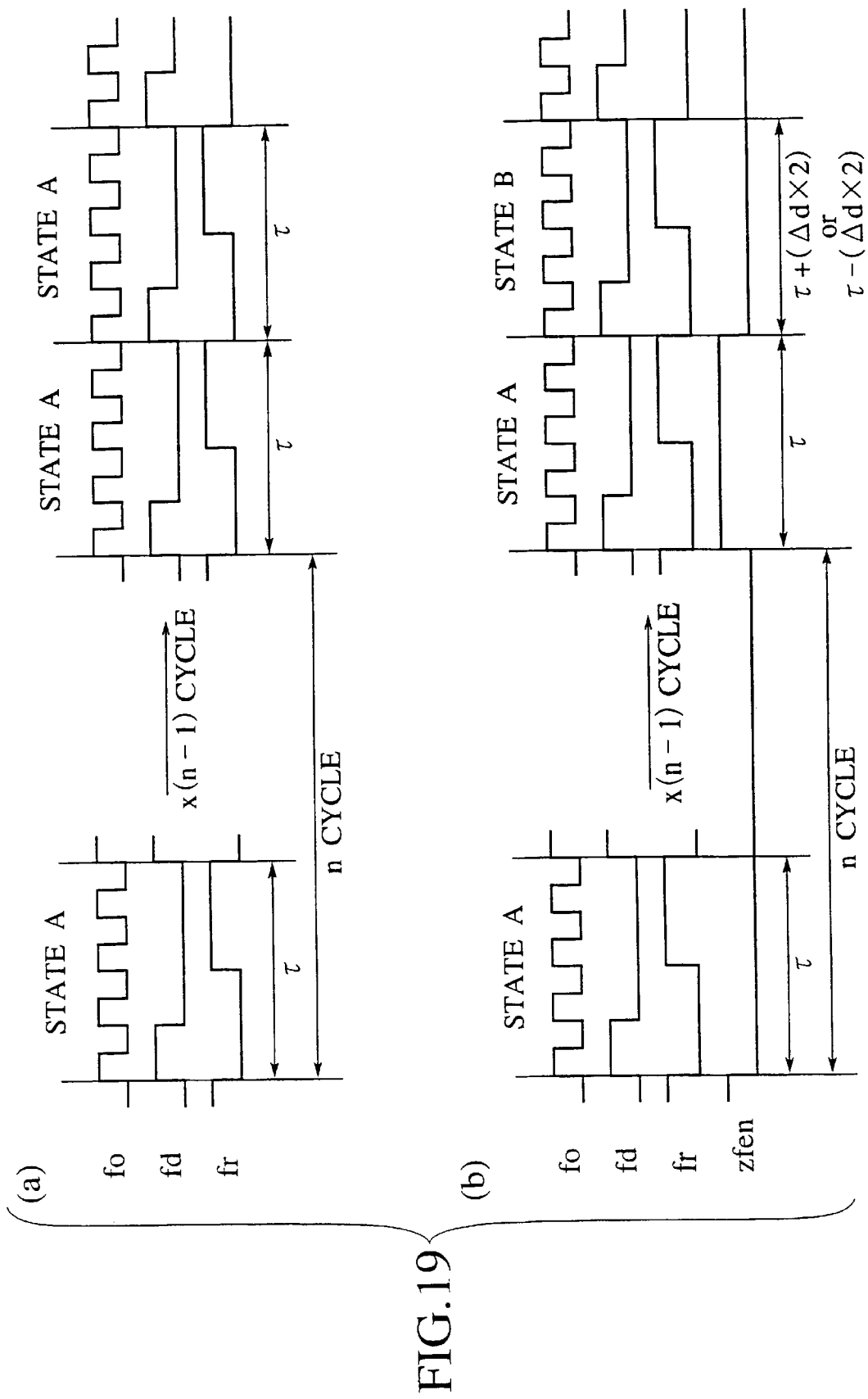
FIG. 19 is a timing chart showing the differences in controlling the multiplied clock generating circuits between the embodiment as illustrated in FIG. 17 and the embodiment as illustrated in FIG. 6.

FIG. 19(*a*) and FIG. 19(*b*) are timing charts showing the differences in controlling the multiplied clock generating circuits between this embodiment as illustrated in FIG. 17 and the previous embodiment as illustrated in FIG. 6. FIG. 19(*a*) is a schematic diagram showing the operation of the multiplied clock generating the previous embodiment as illustrated in FIG. 6. In this case, the condition A is repeatedly continued after repeating the same condition A for n cycles. If the similar situation occurrs in the multiplied clock generating circuit of this embodiment, the output signal zfen of the comparator 12 is pulled up to the high level from the low level after repeating the same condition A in order to control the oscillator circuit 6 to adjust the clock period fdt of the feedback clock signal fd in order to decrement the count of the rising edges of the output clock signal fo as counted while the output signal ctfup of the register 3-1 or the output signal ctfdn of the register 3-2 is pulled up to the high level. By this configuration, because of the phase relationship between the feedback clock signal fd and the input clock signal fr, the clock period fdt of the feedback clock signal fd is adjusted from τ in the condition A to (τ+Δd×2) or (τ−Δd×2) in the condition B.

As a result, by taking control as illustrated in FIG. 19(*b*), the feedback clock signal fd is locked in the condition that the clock period frt of the input clock signal fr is equal to the clock period fdt of the feedback clock signal fd only when the output signal ctfup of the register 3-1 and the output signal ctfdn of the register 3-2 are constantly in the low level through a cycle of the feedback clock signal fd.

Meanwhile, the number n of cycles for use in determining when the output signal zfen of the phase control circuit 11 is pulled up and the number k in the above equation that $$frt-\Delta d \times 2 \times k < fdt < frt+\Delta d \times 2 \times k$$

are associated in order that k decreases as n increases. Also, n and the output clock signal fo are associated in order that, as n increases, the jitter of the output clock signal fo decreases. Furthermore, n and the locking-up time are associated in order that that the locking-up time increases as n increases. Accordingly, the value of n is determined taking into consideration these above relationship in order to meet with the specification as required.

As explained above, in the case of this embodiment, the feedback clock signal fd is locked in order that the clock period fdt of the feedback clock signal fd is equal to the clock period frt of the input clock signal fr or takes on values within the range satisfying $$frt-\Delta d \times 2 \times k < fdt < frt+\Delta d \times 2 \times k$$

where k is an arbitary integer. By this configuration, it is possible to suppress the jitter of the feedback clock signal fd smaller than (Δd×2×k×2) irrespective of the multiplication factor M and to accord the feedback clock signal fd both in frequency and in phase with the input clock signal fr in order to align the rising edge of the feedback clock signal fd with the rising edge of the input clock signal fr.

Next, a further embodiment of the present invention will be explained.

Figure 20:
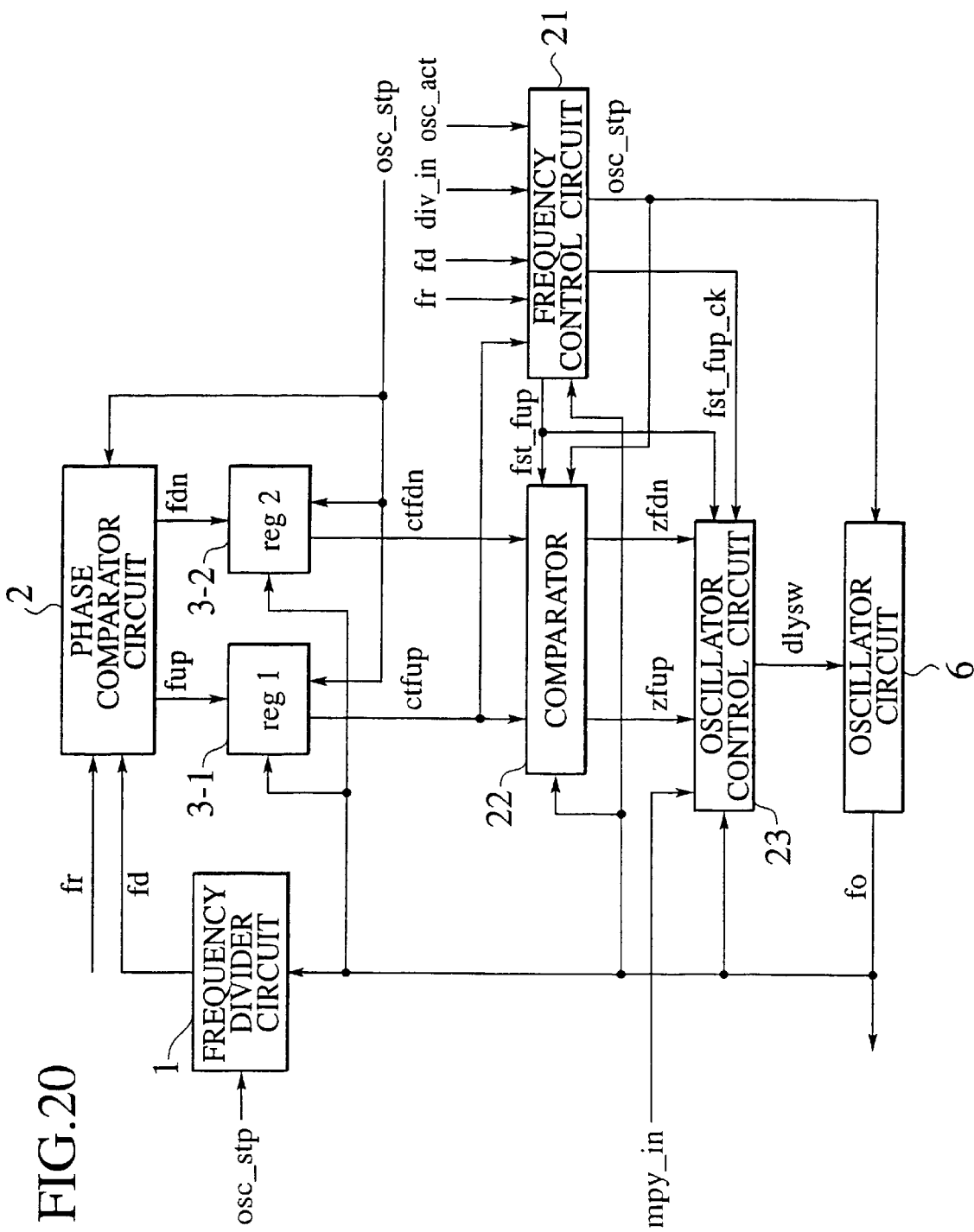
FIG. 20 is a schematic diagram showing a multiplied clock generating circuit in accordance with a further embodiment of the present invention.

FIG. 20 is a schematic diagram showing a multiplied clock generating circuit in accordance with this embodiment of the present invention. In FIG. 20, the multiplied clock generating circuit of this embodiment is constructed in the same manner as the multiplied clock generating circuit as illustrated in FIG. 6 except for provision of a frequency control circuit 21, a comparator 22 in place of the comparator 4 as illustrated in FIG. 6, and an oscillator control circuit 23 in place of the oscillator control circuit 23 as illustrated in FIG. 6. Furthermore, the frequency divider circuit 1, the phase comparator circuit 2, the registers 3-1 and 3-2, the comparator 22 and the oscillator circuit 6 are initialized when a signal osc__stp (in place of the signal osc__act) in the low level is given to these elements, The initial state of the comparator 22 is maintained when a signal fst__fup (as explained in the following description) is in the low level. When the signal fst__fup is in the high level, the operation of the comparator 22 is equivalent to the operation of the comparator 4 of the embodiment illustrated in FIG. 6.

Figure 1:
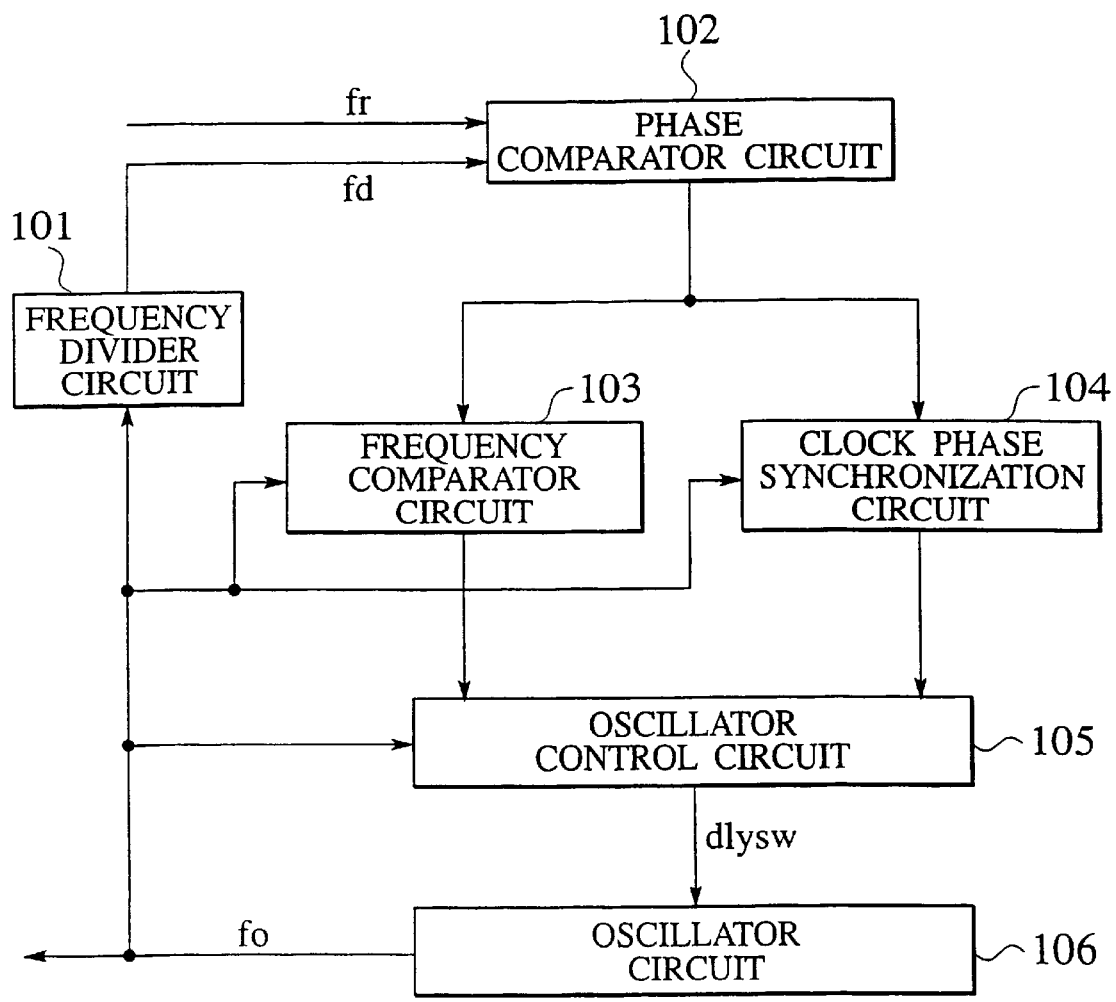
FIG. 1 is a schematic diagram showing an example of a multiplied clock generating circuit for generating a feedback clock signal fd by dividing an output clock signal fo by M and controlling the frequency and the phase of the feedback clock signal fd to match those of an input clock signal fr.
Figure 21:
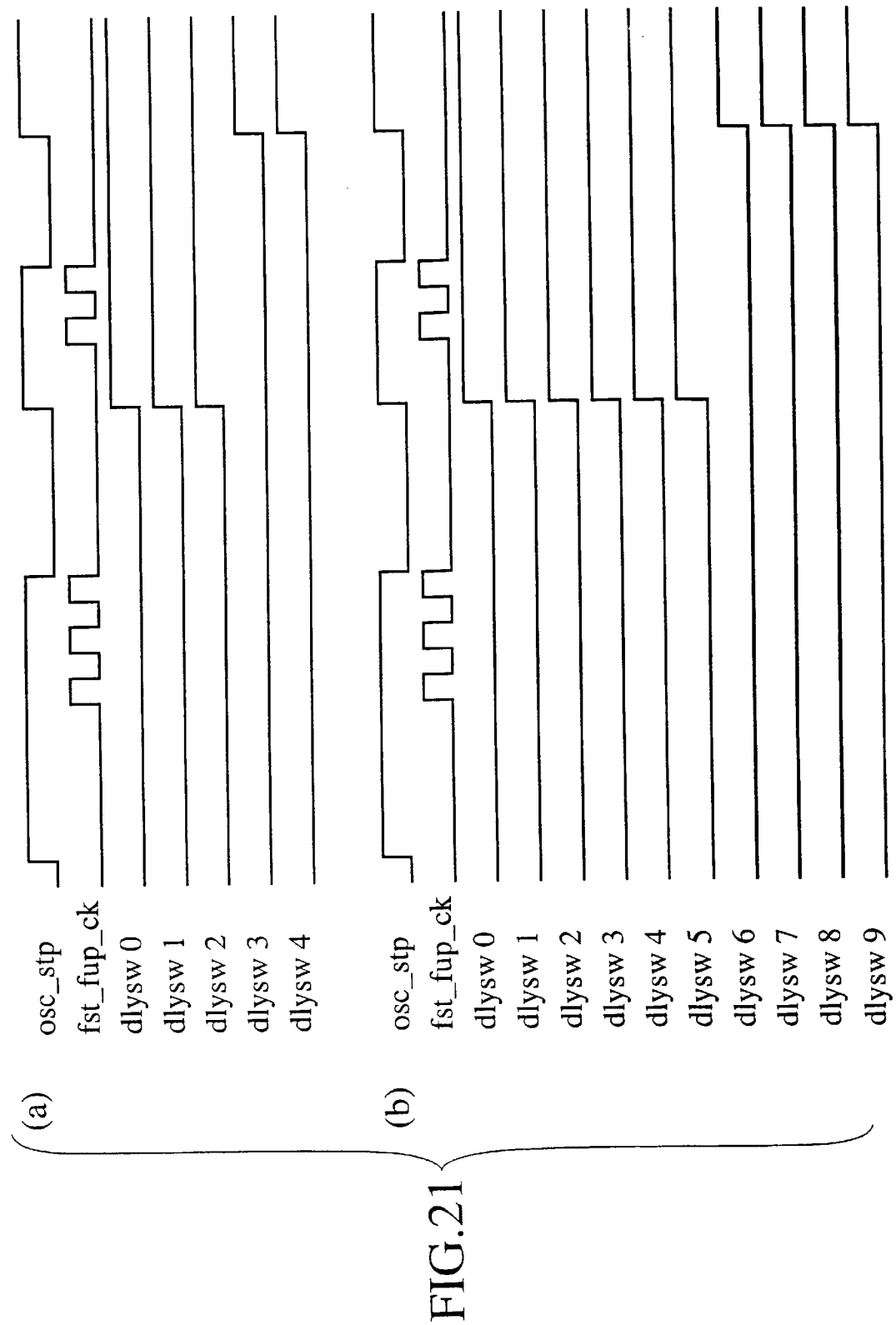
FIG. 21 is a timing chart showing the operational timing of the signal fst_fup_ck in the case of the multiplied clock generating circuit in accordance with said further embodiment of the present invention.

When a signal fst__fup is in the low level, the oscillator control circuit 23 serves to adjust the control signal dlysw in synchronism with the signal osc__stp in order to shorten the delay time of the variable-delay-time delay circuit 112 in the oscillator circuit 6 by the number of the rising edge of the signal fst__fup__ck×mpy__in×Δd. When the signal fst__fup is in the high level, the operation of the oscillator control circuit 23 is equivalent to the operation of the the oscillator control circuit 5 of the embodiment as illustrated in FIG. 6. FIG. 21(*a*) is a timing chart showing the relationship among the signal osc__stp, the signal fst__fup__ck and the control signal dlysw when the signal fst__fup is in the low level and the signal mpy__in=1 in the case where the oscillator circuit 6 of this embodiment is designed in the same manner as illustrated in FIG. 1 in which the variable-delay-time delay cell 112 includes five or more delay cells 114. FIG. 21(b) is a timing chart showing the relationship among the signal osc_stp, the signal fst_fup_ck and the control signal dlysw when the signal fst_fup is in the low level and the signal mpy_in=2 in the case where the oscillator circuit 6 of this embodiment is designed in the same manner as illustrated in FIG. 1 in which the variable-delay-time delay cell 112 includes ten or more delay cells 114.

Next, the signal osc_stp, the signal fst_fup and the signal fst_fup_ck as output from the frequency control circuit 21 will be explained.

The signal osc_stp is constantly in the low level when the signal osc_act input to the frequency control circuit 21 is in the low level. The signal osc_stp is pulled up in synchronism with the rising edge of the input clock signal fr after the signal osc_act is pulled up. Also, when the oscillator circuit 6 initiates its oscillation after the signal osc_stp is pulled up to the high level when the signal fst_fup is in the low level, the signal osc_stp is pulled down to the low level in synchronism with the first falling edge of the output clock signal fo in the second cycle of the feedback clock signal fd and then is pulled up to the high level in synchronism with the rising edge of the input clock signal fr followed by repeating pulling up and down in this manner. After the signal fst_fup is pulled up to the high level, the signal osc_stp is not pulled down once pulled up unless the signal osc_act is pulled down to the low level.

Figure 22:
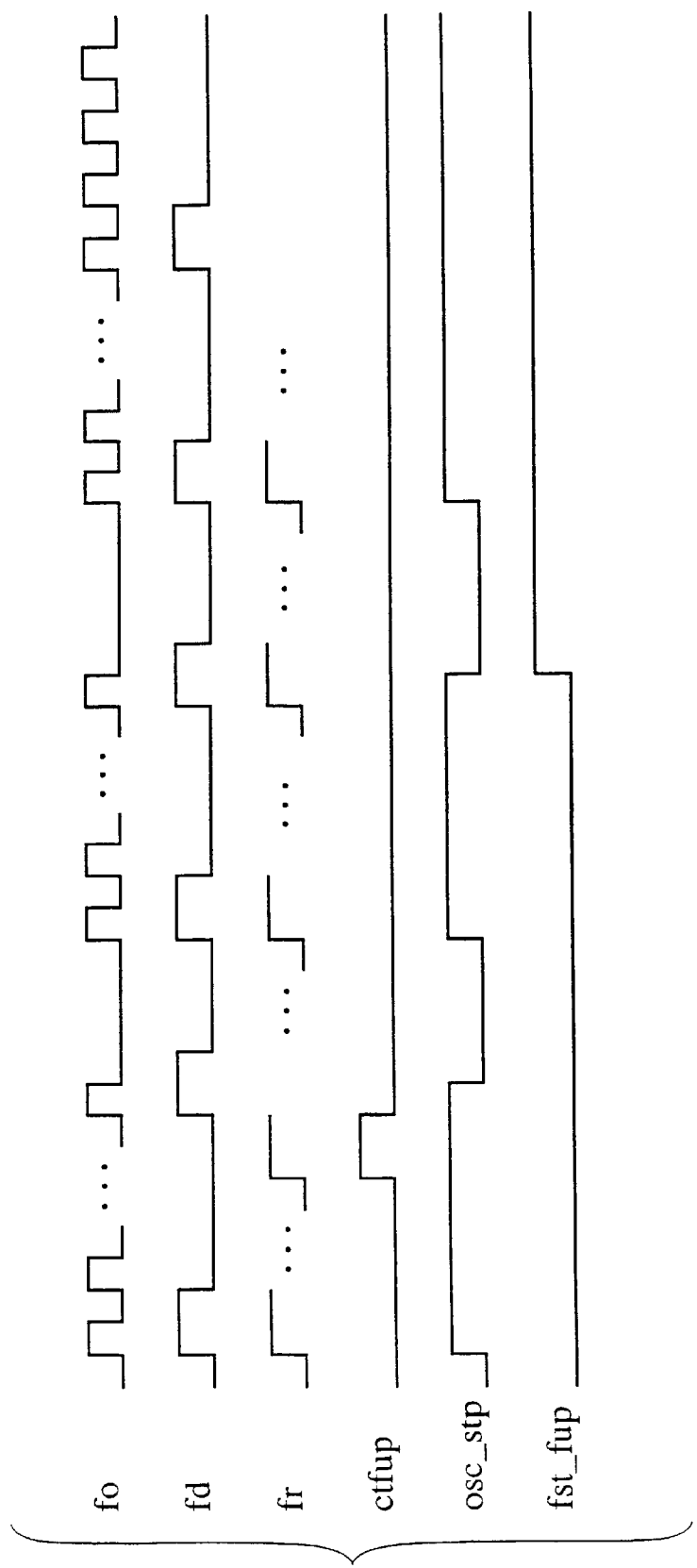
FIG. 22 is a timing chart showing the relationship among the output clock signal fo, the feedback clock signal fd, the input clock signal fr, the output signal ctfup of the register 3-1, the signal osc_stp and the signal fst_fup after the signal osc_act is pulled up to the high level in the case of the multiplied clock generating circuit in accordance with said further embodiment of the present invention.

The signal fst_fup is a first control signal which is output from the frequency control circuit 21 and is in the low level when starting the operation of the multiplied clock generating circuit. In the case where the output signal ctfup is not pulled up to the high level with the signal fst_fup being in the low level and with the signal osc_stp being in the high level, the signal fst_fup is pulled up to the high level in synchronism with the falling edge of the signal osc_stp and maintains the high level thereafter. FIG. 22 is a timing chart showing the relationship among the output clock signal fo, the feedback clock signal fd, the input clock signal fr, the output signal ctfup of the register 3-1, the signal osc_stp and the signal fst_fup after the signal osc_act is pulled up to the high level.

The signal fst_fup_ck is a second control signal which is output from the frequency control circuit 21. When the signal fst_fup is in the low level, one clock of the output clock signal fo is supplied as the signal fst_fup_ck to the oscillator control circuit 23 in every cycn-th cycle (where cycn is an arbitary integer) from the first rising edge of the output clock signal fo after the signal ctfup is pulled up to the high level. The cycn cycles start from the signal div_in given to the frequency control circuit 21 and updated, when cycn>(the count of the rising edges while the signal ctfup is in the high level), to (the count of the rising edges while the signal ctfup is in the high level) in synchronism with the rising edge of the signal osc_stp. This is repeated until the signal fst_fup is pulled up to the high level. Furthermore, after the signal fst_fup is pulled up to the high level, the signal fst_fup_ck remains in the low level.

Figure 23:
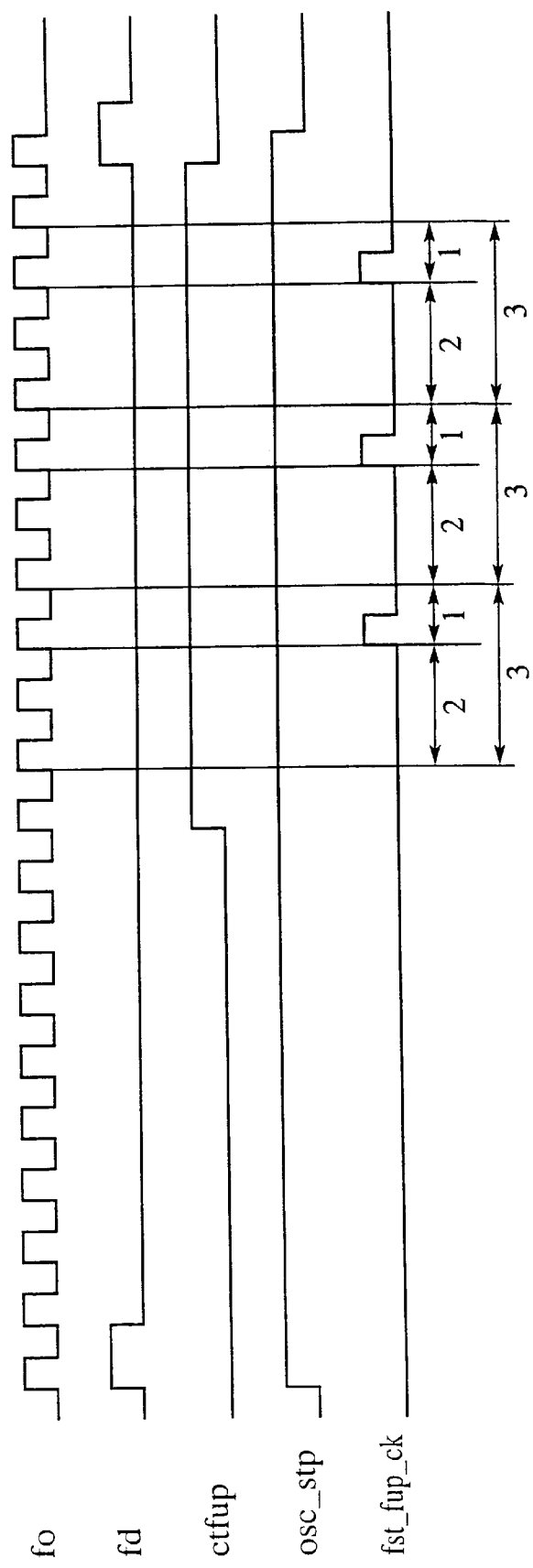
FIG. 23 is a timing chart showing the timing relationship among the output clock signal fo, the feedback clock signal fd, the output signal ctfup of the register 3-1, the signal osc_stp and the signal fst_fup_ck in the case where the value of cycn is 3 in the case of the multiplied clock generating circuit in accordance with said further embodiment of the present invention.
Figure 24:
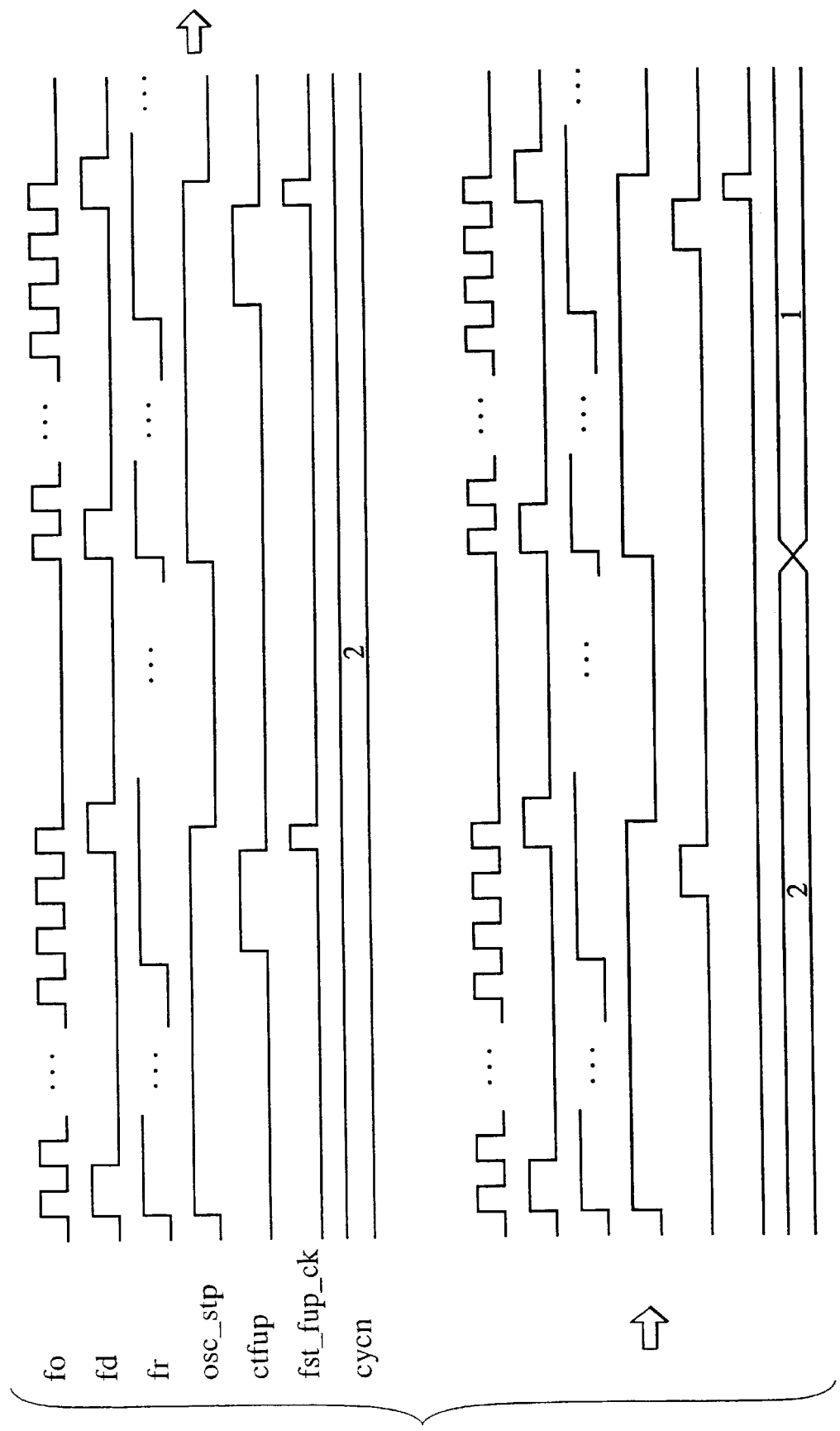
FIG. 24 is a timing chart showing the timing relationship among the output clock signal fo, the feedback clock signal fd, the output signal ctfup of the register 3-1, the signal osc_stp, the signal fst_fup_ck and the value of cycn for the purpose of explaining the case that the value of cycn is updated from "2" to "1". in the case of the multiplied clock generating circuit in accordance with said further embodiment of the present invention.

FIG. 23 is a timing chart showing the timing relationship among the output clock signal fo, the feedback clock signal fd, the output signal ctfup of the register 3-1, the signal osc_stp and the signal fst_fup_ck in the case where the value of cycn is 3. Also, FIG. 24 is a timing chart showing the timing relationship among the output clock signal fo, the feedback clock signal fd, the output signal ctfup of the register 3-1, the signal osc_stp, the signal fst_fup_ck and the value of cycn for the purpose of explaining the case that the value of cycn is updated from "2" to "1".

The signal mpy_in given to the oscillator control circuit 23 and the signal div_in given to the frequency control circuit 21 are determined as explained in the followings.

First, fot_trg is defined as $$frt \div M = fot\_trg$$

where the multiplication factor and the clock period of the input clock signal fr are M and frt respectively.

Also, if $$fot\_trg > M \times \Delta d \times 2,$$

mpy_in and div_in are determined as $$mpy\_in = s1$$

$$div\_in = 1$$

where s1 is the quotient of $$fot\_trg \div M \times \Delta d \times 2.$$

Else if $$fot\_trg = M \times \Delta d \times 2,$$

then $$mpy\_in = 1$$

$$div\_in = 1.$$

Else if $$fot\_trg < M \times \Delta d \times 2,$$

then $$mpy\_in = 1.$$

In this case where fot_trg<M×Δd×2,
 if the surplus is 0, then div_in=s2;
 if not, div_in=s2+1.
where s2 is the quotient of $$M \times \Delta d \times 2 \div fot\_trg.$$

By determining the signal mpy_in and the signal div_in in this manner, the frequency of the feedback clock signal fd approaches to the frequency of the input clock signal fr without substantial overshoot, followed by pulling up the signal fst_fup. The avoidance of overshooting makes it easier to design circuits by improving the operational margin.

As explained heretofore in conjunction with the embodiment as illustrated in FIG. 6, the oscillator circuit 6 is controlled to adjust the clock period of the feedback clock signal fd only by (Δd×2) per rising edge of the output clock signal fo when both the output signal ctfup of the register 3-1 and the output signal zfup of the comparator circuit 22 are pulled up to the high level or when both the output signal ctfdn of the register 3-2 and the output signal zfdn. In this case, when a very high frequency output is obtained by a large multiplication factor, the output range of the oscillator circuit 6 becomes substantially wide so that it takes a long time (which is the locking-up time) to lock the clock period fdt of the feedback clock signal fd within $$frt-\Delta d\times 2 < fdt < frt+\Delta d\times 2.$$

In order to cope with this shortcoming, in the case of this embodiment, the oscillation of the oscillator circuit 6 is started (resumed) at the rising edge of the input clock signal fr and halted at the first falling edge of the output clock signal fo in the second cycle of the feedback clock signal fd, followed by repeating the resumption and halt operation until the frequency of the feedback clock signal fd approaches the frequency of the input clock signal fr, followed by controlling the oscillation as explained in conjunction with the embodiment illustrated in FIG. 6 after convergd, rather than controlling the oscillation, from startup, as explained in conjunction with the embodiment illustrated in FIG. 6. During the repetition, if $$fot\_trg > M \times \Delta d \times 2,$$

the clock period of the feedback clock signal fd is increased/decreased by $$mpy\_in \times M \times \Delta d \times 2$$

once every rising edge of the output clock signal fo with the output signal ctfup of the register 3-1 being pulled up to the high level.

On the other hand, if $$fot\_trg = M \times \Delta d \times 2 \text{ or}$$

$$fot\_trg < M \times \Delta d \times 2,$$

the clock period of the feedback clock signal fd is increased/decreased by (M×Δd×2) once every one or more rising edge of the output clock signal fo with the output signal ctfup of the register 3-1 being pulled up to the high level. By this configuration, the frequency of the feedback clock signal fd is quickly raised, followed by control in accordance with the scheme as explained in conjunction with in the previous embodiment in order to shorten the locking-up time.

Figure 25:
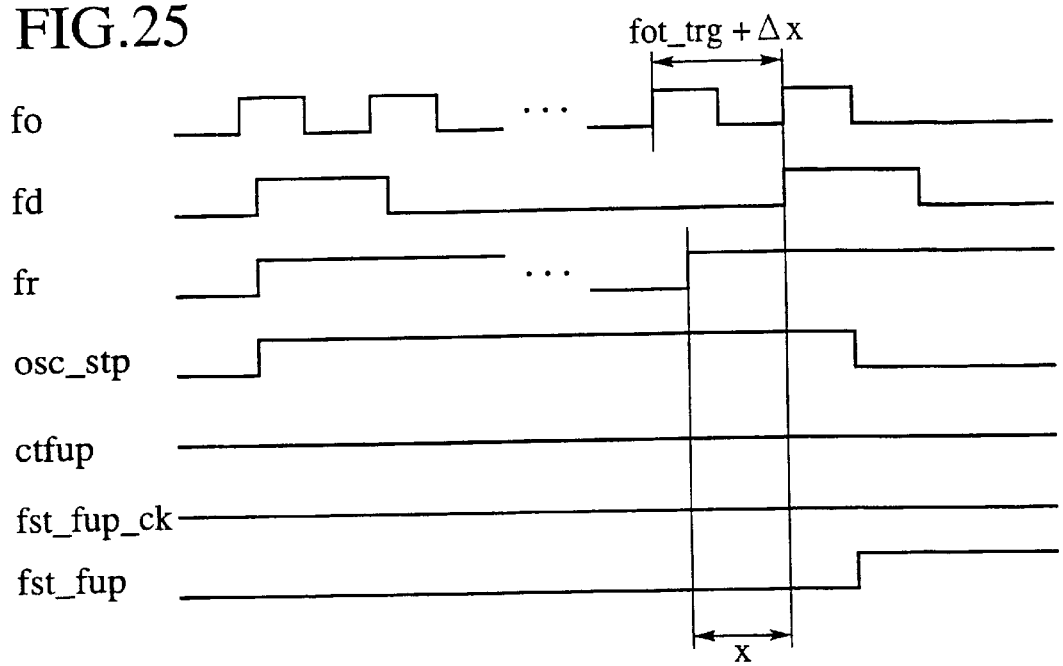
FIG. 25 is a timing chart showing the signal fst_fup in the case of the multiplied clock generating circuit in accordance with said further embodiment of the present invention.

FIG. 25 is a timing chart showing the signal fst_fup which is pulled up when fot_trg≧m×Δd×2. In this case, it is always true that fdt>frt. In FIG. 25, the difference x between the clock period fdt of the feedback clock signal fd and the clock period frt of the clock signal fr satisfies $$x < fot\_trg + \Delta x$$

where $$\Delta x = fot\_trg - fot.$$

This is rearranged as $$fdt - frt < fot\_trg + \Delta x$$

with which the equations $$frt = fot\_trg \times M \text{ and}$$

$$fdt = (fot\_trg + \Delta x) \times M$$

are combined to yield the equation $$\Delta x < fot\_trg/(M-1)$$

resulting in the equation $$fdt - frt < fot\_trg + fot\_trg/(M-1).$$

Figure 26:
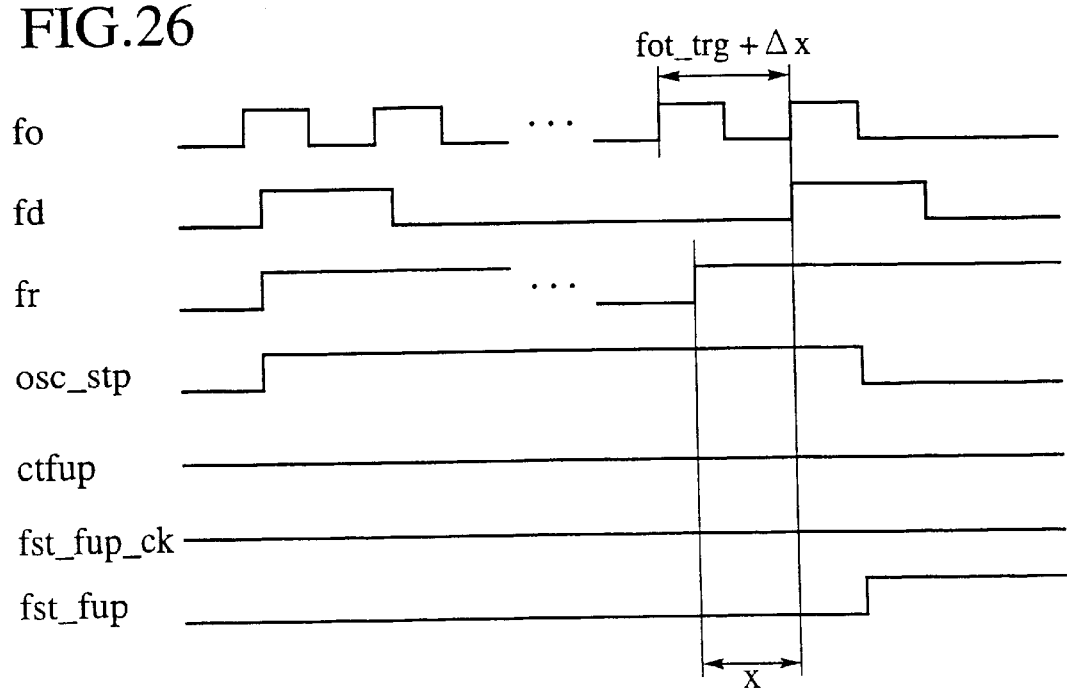
FIG. 26 is a timing chart showing the signal fst_fup in the case of the multiplied clock generating circuit in accordance with said further embodiment of the present invention.
Figure 27:
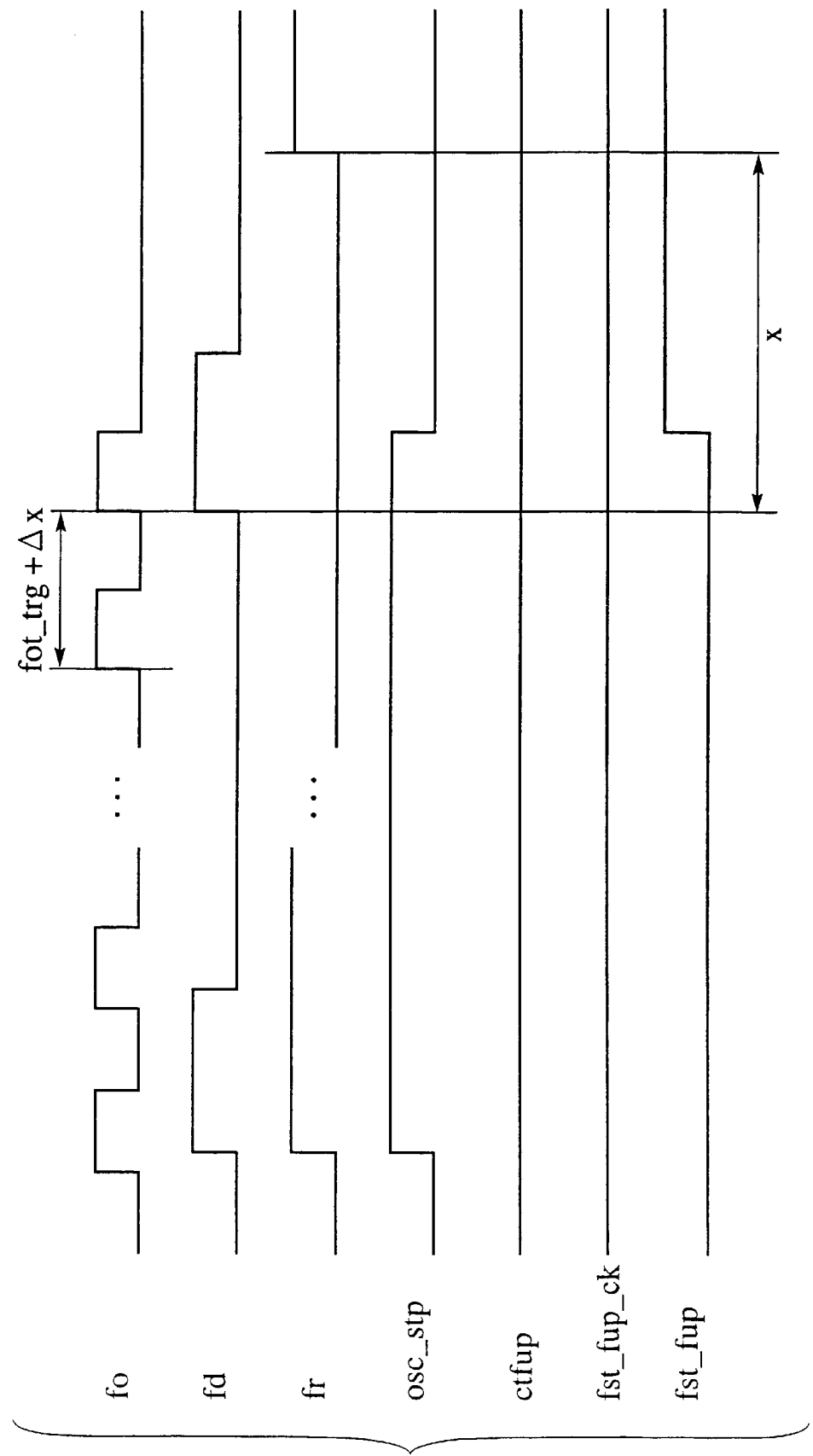
FIG. 27 is a timing chart showing the signal fst_fup in the case of the multiplied clock generating circuit in accordance with said further embodiment of the present invention.

FIG. 26 and FIG. 27 are schematic diagrams showing the signal fst_fup which is pulled up when fot_trg<m×Δd×2. In this case, it can be the case that $$fdt > frt, fdt = frt \text{ or } fdt < frt.$$

FIG. 26 shows the case that fdt>frt in which $$fdt - frt < fot\_trg + fot\_trg/(M-1)$$

as in the case of FIG. 25.

FIG. 27 shows the case that fdt<frt in which Δx satisfies $$-\Delta d \times 2 < \Delta x < 0,$$

resulting in $$frt - fdt < M \times \Delta d \times 2$$

as derived from the control of the signal cycn and the signal div_in as explained heretofore.

As explained above, in accordance with of this embodiment, it is possible to shorten the locking-up time as compared with the oscillator control circuit as illustrated in FIG. 6.

Next, a still further embodiment of the present invention will be explained.

Figure 28:
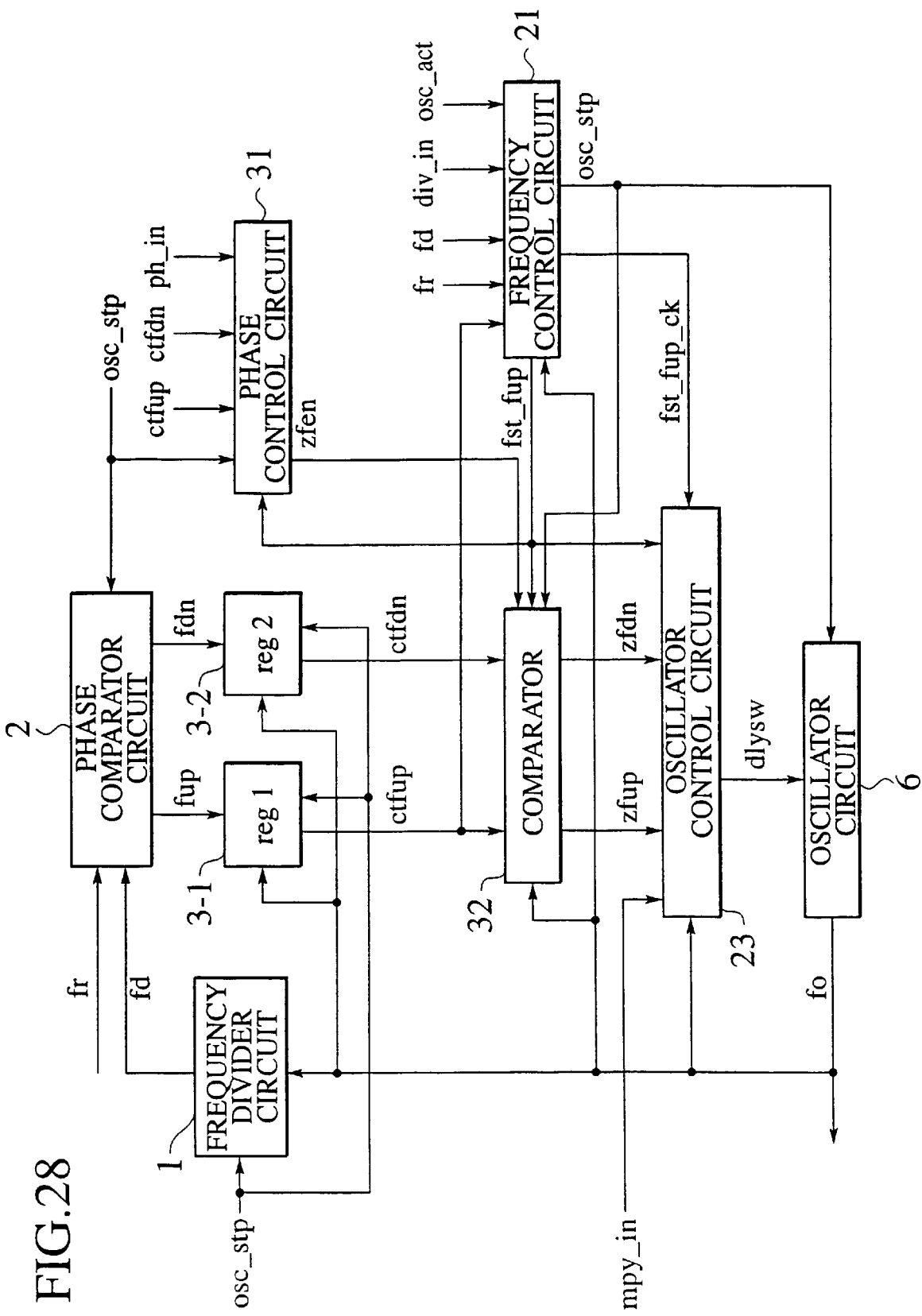
FIG. 28 is a schematic diagram showing a multiplied clock generating circuit in accordance with a still further embodiment of the present invention.

FIG. 28 is a schematic diagram showing a multiplied clock generating circuit in accordance with this embodiment of the present invention. In FIG. 28, the multiplied clock generating circuit of this embodiment is constructed in the same manner as the multiplied clock generating circuit as illustrated in FIG. 20 except for provision of a phase control circuit 31 and a comparator 32 in place of the comparator 22 as illustrated in FIG. 20.

The phase control circuit 31 maintains its initial state while the signal fst_fup as given from the frequency control circuit 21 is in the low level, and is controlled in the same manner as the embodiment illustrated in FIG. 17 after the signal fst_fup is pulled up to the high level.

The comparator 32 maintains its initial state while the signal fst_fup as given from the frequency control circuit 21 is in the low level in the same manner as the embodiment illustrated in FIG. 20, and is controlled in the same manner as the embodiment illustrated in FIG. 17 after the signal fst_fup is pulled up to the high level.

Accordingly, in accordance with this embodiment, it is possible to to shorten the locking-up time in addition to the advantages obtained by the embodiment as illustrated in FIG. 17 by providing the phase control circuit 31 as illustrated in FIG. 17 and the frequency control circuit 21 as illustrated in FIG. 20.

As explained above, in accordance with the embodiments of the present invention, it is possible to control the clock period of the feedback clock signal equal to the clock period of the input clock signal or within a certain displacement, in relation to the clock period of the input clock signal, according to the minimum unit of delay adjustment of the oscillator circuit, and therefore to provide a multiplied clock generating circuit in which the jitter of the feedback clock signal fd is suppressed, irrespective of the multiplication factor, within a certain displacement according to the minimum unit of delay adjustment of the oscillator circuit.

Also, in addition to the above advantages, it is possible to always align the phase of the feedback clock signal to the phase of the input clock signal.

Furthermore, in addition to the above advantages, it is possible to shorten the locking-up time of the feedback clock signal with reference to the input clock signal. The foregoing description of the embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a phase displacement signal indicative of the phase relationship between said input clock signal and said feedback clock signal;

a comparator which is configured to receive said phase displacement signal, to count said output clock signal within each cycle of said feedback clock signal while said phase displacement signal is indicative that there is a phase displacement between said feedback clock signal and said input clock signal, to compare the numbers as counted in successive cycles of said feedback clock signal, and to output a delay time adjustment signal on the basis of the result of the comparison; and an oscillator circuit which is capable of controlling said output clock signal in the clock period thereof by an increment(s) of a predetermined delay time on the basis of said delay time adjustment signal and outputting said output clock signal as controlled.

2. The multiplied clock generating circuit as claimed in claim 1 further comprising a register circuit which is connected between said phase comparator circuit and said comparator and configured to latch the output signal of said phase comparator circuit and to output, as said phase displacement signal, said output signal of said phase comparator circuit as latched in synchronism with said output clock signal.

3. The multiplied clock generating circuit as claimed in claim 2 further comprising an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit and said predetermined delay time.

4. The multiplied clock generating circuit as claimed in claim 1 wherein said phase displacement signal is a pair of first and second signals, said first signal being indicative that the rising edge of said feedback clock signal is advanced ahead of the rising edge of said input clock signal, said second signal being indicative that the rising edge of said feedback clock signal lags behind the rising edge of said input clock signal.

5. The multiplied clock generating circuit as claimed in claim 2 wherein said register circuit is composed of a pair of first and second register elements, said first register element being configured to latch said first signal of said phase displacement signal said said register element being configured to latch said second signal of said phase displacement signal.

6. The multiplied clock generating circuit as claimed in claim 1 wherein said multiplied clock generating circuit is designed as a phase lock loop circuit.

7. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a phase displacement signal indicative of the phase relationship between said input clock signal and said feedback clock signal;

a phase control circuit which is configured to receive said phase displacement signal, to count said output clock signal within each cycle of said feedback clock signal while said phase displacement signal is indicative that there is a phase displacement between said feedback clock signal and said input clock signal, to compare the numbers as counted in successive cycles of said feedback clock signal, and to output a phase adjustment signal on the basis of the result of the comparison in the case where the same count of said feedback clock signal is maintained for a predetermined number of cycles; and an oscillator circuit which is configured to receive said phase adjustment signal from said phase control circuit as a delay time adjustment signal and is capable of controlling said output clock signal in the clock period thereof by an increment(s) of a predetermined delay time on the basis of said delay time adjustment signal and outputting said output clock signal as controlled.

8. The multiplied clock generating circuit as claimed in claim 7 further comprising a register circuit which is connected between said phase comparator circuit and said comparator and configured to latch the output signal of said phase comparator circuit and to output, as said phase displacement signal, said output signal of said phase comparator circuit as latched in synchronism with said output clock signal.

9. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal;

a register circuit which is configured to latch the output signal of said phase comparator circuit and to output, as a phase displacement signal, said output signal of said phase comparator circuit as latched in synchronism with said output clock signal;

a phase control circuit which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a phase adjustment signal on the basis of the result of the comparison in the case where the same count of said feedback clock signal is maintained for a predetermined number of cycles; and a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, to output a delay time adjustment signal with reference to the result of the comparison if the phase adjustment signal is not given from said phase control circuit and to output a delay time adjustment signal when the number as counted of said feedback clock signal of each cycle of said feedback clock signal reaches the number as counted of said feedback clock signal in the cycle previous to said each cycle decremented by 1 if the phase adjustment signal is given from said phase control circuit;

an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit.

10. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a phase displacement signal indicative of the phase relationship between said input clock signal and said feedback clock signal;

a frequency control circuit which is configured to receive said phase displacement signal, said input clock signal and said feedback clock signal and to output a frequency control signal if the clock period of said feedback clock signal is longer than the clock period of said input clock signal by no smaller than a predetermined width;

a comparator which is configured to receive said phase displacement signal outputted from said register circuit, to count said output clock signal within each cycle of said feedback clock signal while said phase displacement signal is indicative that there is a phase displacement between said feedback clock signal and said input clock signal, to compare the numbers as counted in successive cycles of said feedback clock signal, and to output a delay time adjustment signal on the basis of the result of the comparison; and an oscillator circuit which is capable of controlling said output clock signal in the clock period thereof by an increment(s) of a short delay time on the basis of said delay time adjustment signal if said frequency control signal is not output and by an increment(s) of a long delay time greater than said predetermined delay time if said frequency control signal is output and outputting said output clock signal as controlled.

11. The multiplied clock generating circuit as claimed in claim 10 further comprising a register circuit which is connected between said phase comparator circuit and said comparator and configured to latch the output signal of said phase comparator circuit and to output, as said phase displacement signal, said output signal of said phase comparator circuit as latched in synchronism with said output clock signal.

12. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal;

a register circuit which is configured to latch the output signal of said phase comparator circuit and to output, as a phase displacement signal, said output signal of said phase comparator circuit as latched in synchronism with said output clock signal;

a frequency control circuit which is configured to receive said phase displacement signal outputted from said register circuit, said input clock signal and said feedback clock signal and to output first and second frequency control signals indicative of a predetermined width by which the clock period of said feedback clock signal is adjusted if the clock period of said feedback clock signal is longer than the clock period of said input clock signal by no smaller than a predetermined width;

a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a delay time adjustment signal on the basis of the result of the comparison or the number as counted and said phase displacement signal outputted from said register circuit;

an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit and said predetermined delay time if said first control signal is given from said frequency control circuit, and in order to shorten the clock period of said feedback clock signal on the basis of said second the control signal as given from said frequency control circuit.

13. A multiplied clock generating circuit for generating and outputting an output clock signal that has a higher frequency than an input clock by a factor M, comprising:

a frequency divider circuit which is configured to generate a feedback clock signal by dividing said output clock signal by a factor M;

a phase comparator circuit which is configured to receive said input clock signal and said feedback clock signal as generated by said frequency divider circuit, to compare the phase of said input clock signal with the phase of said feedback clock signal and to output a signal indicative of the phase relationship between said input clock signal and said feedback clock signal;

a register circuit which is configured to latch the output signal of said phase comparator circuit and to output, as a phase displacement signal, said output signal of said phase comparator circuit as latched in synchronism with said output clock signal;

a phase control circuit which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, and to output a phase adjustment signal on the basis of the result of the comparison in the case where the same count of said feedback clock signal is maintained for a predetermined number of cycles; and a frequency control circuit which is configured to receive said phase displacement signal outputted from said register circuit, said input clock signal and said feedback clock signal and to output a frequency control signal if the clock period of said feedback clock signal is longer than the clock period of said input clock signal by no smaller than a predetermined width;

a comparator which is configured to receive said phase displacement signal outputted from said register circuit, to count said output clock signal in relation to said phase displacement signal outputted from said register circuit within each cycle of said feedback clock signal, to compare the numbers as counted in successive cycles of said feedback clock signal, to output a delay time adjustment signal on the basis of the result of the comparison, and to maintain an initialized state thereof when a first control signal is given from said frequency control circuit; and an oscillator circuit which is capable of controlling said output clock signal in the clock period thereof by an increment(s) of a predetermined delay time on the basis of said delay time adjustment signal and outputting said output clock signal as controlled; and an oscillator control circuit which is configured to count said output clock signal in relation to said phase displacement signal outputted from said register circuit and the output signal of said comparator, to output said delay time adjustment signal to said oscillator circuit in order to shorten the clock period of said feedback clock signal by a value corresponding to the number as counted by said oscillator control circuit and said predetermined delay time or in order to elongate the clock period of said feedback clock signal by a value corresponding to the number as counted by said oscillator control circuit and said predetermined delay time if said first control signal is given from said frequency control circuit, and in order to shorten the clock period of said feedback clock signal on the basis of said second the control signal as given from said frequency control circuit.

\* \* \* \* \*